US007602322B2

(12) United States Patent
Tanimura et al.

(10) Patent No.: US 7,602,322 B2
(45) Date of Patent: Oct. 13, 2009

(54) ANALOG-TO-DIGITAL CONVERSION CONTROLLER, OPTICAL RECEIVING DEVICE, OPTICAL RECEIVING METHOD, AND WAVEFORM-DISTORTION COMPENSATING DEVICE

(75) Inventors: Takahito Tanimura, Kawasaki (JP); Hisao Nakashima, Kawasaki (JP); Takeshi Hoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/068,234

(22) Filed: Feb. 4, 2008

(65) Prior Publication Data

US 2008/0198051 A1  Aug. 21, 2008

(30) Foreign Application Priority Data

Feb. 16, 2007   (JP) .............................. 2007-037184

(51) Int. Cl.
*H03M 1/06* (2006.01)
(52) U.S. Cl. ....................... 341/118; 341/119; 341/120; 341/121; 341/139; 341/155
(58) Field of Classification Search ................. 341/111, 341/118, 123, 139, 142, 155
See application file for complete search history.

(56) References Cited

U.S. PATENT DOCUMENTS 5,671,253 A * 9/1997 Stewart ...................... 375/316
5,705,949 A * 1/1998 Alelyunas et al. ........... 329/304
5,796,358 A * 8/1998 Shih et al. ................... 341/139
6,198,416 B1 * 3/2001 Velazquez ................... 341/118
6,438,163 B1 * 8/2002 Raghavan et al. ........... 375/233
6,483,447 B1 * 11/2002 Eglit .......................... 341/111

(Continued)

FOREIGN PATENT DOCUMENTS

EP           0 812 075         12/1997

(Continued)

OTHER PUBLICATIONS

Tanimura et al. U.S. Appl. No. 11/967,394, filed Dec. 31, 2007 "Analog-to-Digital conversion controller, optical Receiving Device, Optical Receiving Method, and Waveform-Distortion Compensating Device".*

(Continued)

*Primary Examiner*—Linh V Nguyen
(74) *Attorney, Agent, or Firm*—Staas & Halsey LLP

(57) ABSTRACT

An optical receiving device of the present invention receives optical signals from an optical transmitting device which uses a modulation format wherein an optical intensity waveform of each symbol is return-to-zero (RZ) pulse, and converts the received optical signals into digital signals by a conversion process of an analog to digital (AD) converter. A control-value calculating unit subsequent to the AD converter digitally processes the digital signals, retrieves an absolute value of the digital signals or a value corresponding one-to-one with the absolute value of the digital signals, estimates errors from an appropriate timing of a sampling timing in the AD converter based on the absolute value of the digital signals or the value corresponding one-to-one with the absolute value of the digital signals, and calculates a control value controlling the sampling timing based on the estimated errors. Based on the control value, a phase of a pulse regulating the sampling timing of AD conversion can be compensated.

33 Claims, 12 Drawing Sheets

U.S. PATENT DOCUMENTS

| | | | |
|---|---|---|---|
| 6,621,862 B1 * | 9/2003 | Dabell | 375/229 |
| 6,678,319 B1 * | 1/2004 | Jamali | 375/234 |
| 6,795,494 B1 * | 9/2004 | Phanse et al. | 375/219 |
| 6,941,078 B1 | 9/2005 | Onaka | |
| 7,224,911 B2 * | 5/2007 | Dai et al. | 398/209 |
| 7,330,141 B2 * | 2/2008 | Temerinac et al. | 341/120 |
| 7,336,729 B2 * | 2/2008 | Agazzi | 375/316 |
| 2004/0120433 A1 | 6/2004 | Duda et al. | |
| 2007/0223570 A1 | 9/2007 | Goto | |

FOREIGN PATENT DOCUMENTS

| | | |
|---|---|---|
| JP | 06-053906 | 2/1994 |
| JP | 8-163027 | 6/1996 |
| JP | 08-163027 | 6/1996 |
| JP | 2000-292263 | 10/2000 |
| JP | 2002-171203 | 6/2002 |
| JP | 2002-198906 | 7/2002 |
| JP | 2002-261692 | 9/2002 |
| JP | 2003-258606 | 9/2003 |
| JP | 2004-080701 | 3/2004 |
| JP | 2005-159553 | 6/2005 |
| WO | 2005/117285 | 12/2005 |
| WO | 2007/132503 | 11/2007 |
| WO | 2008-038337 | 4/2008 |

OTHER PUBLICATIONS

Notice of Rejection for corresponding Japanese Application 2007-037184; mailed Jan. 27, 2009.

Dany Sebastien et al., "Unrepeated 210-km Transmission with Coherent Detection and Digital Signal Processing of 20-Gb/s QPSK Signal", Optical Fiber Communication Conference & Exposition 2005. (3 pages).

Timo Pfau et al., "1.6 Gbit/s Real-Time Synchronous QPSK Transmission with Standard DFB Lasers", European Conference on Optical Communication 2006. (2 pages).

"20 Msymbol/s, 64 and 128 QAM coherent optical transmission over 525 km using heterodyne detection with frequency-stabilised laser"; M. Nakazawa, M. Yoshida, K. Kasai, J. Hongou; vol. 42, No. 12, pp. 57-58; Jun. 8, 2006.

Bogoni et al.; "OTDM-based optical communications networks at 160 Gbit/sand beyond"; Dec. 9, 2006; Optical Fiber Technology, Academic Press, London, US; pp. 1-12.

Extended European Search Report for corresponding European Application 08000030.0-2206; mailed Jul. 28, 2008.

Partial European Search Report for corresponding European Application 08000030.0-2206.

* cited by examiner

FEEDBACK FOR DELAYING PHASE 0 (NO FEEDBACK)

FEEDBACK FOR ADVANCING PHASE

| ACCUMULATED WAVELENGTH DISPERSION | $C_0$ | $C_1$ | .. | $C_n$ |
|---|---|---|---|---|
| −1000 ps/nm | $C_{0\_m10}$ | $C_{1\_m10}$ | .. | $C_{n\_m10}$ |
| −900 ps/nm | $C_{0\_m09}$ | $C_{1\_m09}$ | .. | $C_{n\_m09}$ |
| : | : | : | : | : |
| 0 ps/nm | $C_{0\_000}$ | $C_{1\_000}$ | .. | $C_{n\_000}$ |
| : | : | : | : | : |
| 900 ps/nm | $C_{0\_p09}$ | $C_{1\_p09}$ | .. | $C_{n\_p09}$ |
| 1000 ps/nm | $C_{0\_p10}$ | $C_{1\_p10}$ | .. | $C_{n\_p10}$ |

ANALOG-TO-DIGITAL CONVERSION CONTROLLER, OPTICAL RECEIVING DEVICE, OPTICAL RECEIVING METHOD, AND WAVEFORM-DISTORTION COMPENSATING DEVICE

BACKGROUND OF THE INVENTION

1. Field of the Invention

The present invention relates to an analog-to-digital (AD) conversion controller that controls an AD converter that converts received signals into digital signals by performing an AD conversion at a predetermined sampling timing in an optical receiving device that receives optical signals, an optical receiving device that include the AD conversion controller, an optical receiving method, and a waveform-distortion compensating device that equalizes a waveform of received signals that are subjected to the AD conversion in the AD converter.

2. Description of the Related Art

In recent years, a coherent optical communication has become focused as means for satisfying a demand for a high-speed network with a large capacity. This is because a coherent optical communication has an excellent resistance against optical noises and is more immune to the influence of amplification relay, and thus poses less restriction on the transmission distance.

The transmission distance of the optical communication is restricted due to noises and waveform distortion. The noise can be reduced by the excellent optical noise resistance of the coherent optical communication. On the other hand, the waveform distortion is a problem, for example, dispersion properties of a transmission channel, in particular wavelength dispersion poses a problem. The wavelength dispersion is a phenomenon in which group delay of optical signals changes according to frequency.

In the coherent optical communication, the phase data as well as the strength of the optical signal is not lost in detection and conversion into electric signals. Therefore, the effect of wavelength dispersion on the signals in an optical region can be easily compensated by a linear circuit at the level of electric signals obtained as a result of detection and conversion. In other words, when compared with a commonly used system that directly detects the waves by extracting only an optical strength by square-law detection, the coherent optical communication has a high capability of electric waveform distortion compensation to compensate the waveform distortion at the level of the electric signals.

Thus, the high electric waveform distortion compensation capability can be obtained in the coherent optical communication. For realizing the electric waveform distortion compensation, detecting and compensating a relative optical phase difference between a local light and the optical signals is necessary. One method to realize this is disclosed in Kazuhiro Katoh, Kazuro Kikuchi, "Unrepeated 210-km Transmission with Coherent Detection and Digital Signal Processing of 20-Gb/s QPSK Signal", Optical Fiber Communication Conference & Exposition 2005, Year 2005. According to which, the optical signals are coherently received and AD conversion is carried out. The converted digital signals are further accumulated in a storage unit and, the optical phase difference between the optical signal and a local light is calculated based on the accumulated digital signals through digital signal processing, and the optical phase difference is compensated to detect the optical signal.

In Timo Pfau et al., "1.6 Gbit/s Real-Time Synchronous QPSK Transmission with Standard DFB Lasers", European Conference On Optical Communication 2006, Year 2006, a method is disclosed in which the optical signals of 1.6 gigabits per second (Gbit/s) are coherently received and AD conversion is carried out. Based on the optical phase difference between the optical signal and a local light calculated by a processor based on the AD converted digital signals, the optical phase difference is canceled and transmission is carried out in real time.

Thus, the coherent optical communication has high electric waveform distortion compensation capability, and as a method for compensating the electric waveform distortion, various techniques are disclosed. For example, Japanese Patent Application Laid-open No. H8-163027 (paragraph [0005], FIG. 1) discloses an optical signal receiving processing circuit which includes a delay unit causing the received optical signals or the electric signals obtained through conversion of the received optical signals by a photoelectric converter to delay, a coefficient multiplier that multiplies each delayed output signal by a coefficient, an adder that adds the output signals of each coefficient multiplier, and a coefficient operator that calculates the coefficient mentioned earlier.

Further, Japanese Patent Application Laid-open No. 2003-258606 (paragraphs [0020] to [0031], FIG. 1) discloses an optical signal receiving processing circuit in which a delay time is set in a level-shift circuit and an amplifier is formed of an exclusive OR gate. An output node is shared by amplifiers and a common load resistance ZL is arranged at the common node. All output electric currents are added at the common load resistance ZL and the added electric currents are converted into a voltage. By using this optical signal receiving processing circuit, compensation can be carried out simultaneously without discrimination between the wavelength dispersion and polarized wave dispersion.

Still further, Japanese Patent Application Laid-open No. 2000-292263 (paragraphs [0007] and [0008], FIG. 1) discloses an optical receiver that includes a photoelectric converter, an equalizer, and a microprocessor. The equalizer is connected to at least one distortion detector, and both the distortion detector and the equalizer are connected to a common controlling unit via the microprocessor. In this optical receiver, parameters of polarization mode dispersion are directly measured. A measurement result can be used for analysis of the equalizer. Furthermore, the parameters of the polarization mode dispersion can be measured with respect to the input signals irrespective of the modulation.

Still further, Japanese Patent Application Laid-open No. 2002-171203 (paragraph [0012], FIG. 1) discloses an echo canceller that includes an initial value data storage unit that stores therein multiple initial value candidates used as an initial value in an echo canceling process, an initial value determining unit that specifies an optimum initial value upon obtaining residual signals when the respective initial value candidate is applied from the initial value candidates stored in the initial value data storage unit, an internal status updating unit that updates an internal status amount by using the initial value specified in the initial value determining unit as the initial value, and an adaptive filter that updates, based on the internal status amount updated by the internal status updating unit, a filter coefficient and creates an echo replica.

In general, for avoiding a loss of the strength and phase data of the optical signals in AD conversion, a sampling rate of the AD conversion must be sufficiently higher than a symbol rate of the optical signals. Furthermore, executing an appropriate arithmetic process is necessary. The above-mentioned technique disclosed in Kazuhiro Katoh, Kazuro Kiuchi, "Unrepeated 210-km Transmission with Coherent Detection and Digital Signal Processing of 20-Gb/s QPSK Signal", Optical Fiber Communication Conference & Exposition 2005, Year 2005 does not realize real-time transmission because the sampling rate of the AD conversion is not sufficiently higher than the symbol rate of the optical signals, and an exceptionally complicated arithmetic operation must be performed for obtaining data of the optical signals. On the other hand, the technique disclosed in Timo Pfau and others, "1.6 Gbit/s Real-Time Synchronous QPSK Transmission with Standard DFB Lasers", European Conference On Optical Communication 2006, Year 2006, though realizing a real-time transmission, achieves a bit rate only as high as 1.6 Gbit/s.

For example, for realizing the transmission in real time with high-speed optical signals exceeding 20 giga-symbols per second (Gsymbol/s), either an extremely high-speed sampling rate or a complex calculation or both are necessary. Because of technical constraints, a cost, and a space, realizing the transmission in real time is very difficult.

Even if an AD converter that realizes a high-speed sampling rate can be implemented, a processing load on a processor processing the digital signal in a subsequent step increases. Then, a circuit scale of the processor or a drive frequency must be increased. Thus, the technology is scarcely useful because of the technical constraints, the cost, and the space.

In other words, because of various constraints, the sampling rate of the AD converter needs to be low as far as possible. Therefore, the sampling rate of the AD conversion must be set to a value close to the symbol rate of the optical signals. In other words, the sampling rate of the AD conversion must be set equivalent to or at most several times the symbol rate of the optical signals.

However, when the sampling rate of the AD conversion is lowered as far as possible and becomes lower than several times the symbol rate of the optical signals, a sampling timing of the AD conversion must be synchronized with a symbol of the received optical signals substantially. If a sampling frequency of the AD conversion shifts from the timing of the symbol, data included in the received optical signals cannot be retrieved by a high signal-to-noise ratio, and an error rate increases.

In the conventional technique as represented by Japanese Patent Application Laid-open No. H8-163027 (paragraph [0005], FIG. 1), the coefficient to be multiplied with the input signals for compensating the waveform distortion is calculated according to the level of output signals of the optical signal receiving processing circuit. Therefore, the technique allows for automatic control to adjust to the changes in a transmission channel caused over time or changes caused by temperature variation. However, compensation of waveform distortion cannot be carried out swiftly in an early stage of the optical signal receiving process.

In the conventional technology as represented by Japanese Patent Application Laid-open No. 2003-258606 (paragraphs [0020] to [0031], FIG. 1), even if resolution power of the delay time can be easily set at will and a large output amplification of the output signals can be easily secured, it is necessary to implement a complex circuit in a connection circuit. However, mounting the complex circuit is not easy.

In the conventional technique as represented by Japanese Patent Application Laid-open No. 2000-292263 (paragraph [0007] and [0008], FIG. 1), even if the waveform distortion can be compensated by detecting the waveform distortion in high-speed and analyzing a detection result by the equalizer, it is necessary to implement the complex circuit in the connection circuit similarly as in the conventional technology represented by Japanese Patent Application Laid-open No. 2003-258606 (paragraphs [0020] to [0031], FIG. 1), and mounting of the complex circuit is not easy.

The conventional technique as represented by Japanese Patent Application Laid-open No. 2002-171203 (paragraph [0012], FIG. 1) is related to the echo canceller. Even if the technique is applied for compensating the waveform distortion, executing a complex algorithm for compensating the waveform distortion is necessary, and therefore swift waveform distortion compensation is difficult to perform.

Further, even if the conventional techniques mentioned above are combined, with respect to the digital signals after AD conversion, the waveform distortion cannot be compensated in the high-speed in a simple structure. For example, when a redundantly structured transmission channel is switched from an operating system to a standby system, compensating the waveform distortion of a new transmission channel takes time. Therefore, the transmission channel cannot be rapidly switched, and communication remains to be cut over a predetermined period of time.

SUMMARY OF THE INVENTION

It is an object of the present invention to at least partially solve the problems in the conventional technology.

According to one aspect of the present invention, an analog-to-digital (AD) conversion controller that controls, in an optical receiving device receiving optical signals of which an optical intensity waveform of each symbol is a return-to-zero (RZ) pulse, an AD converter that converts received signals into digital signals by AD conversion at a predetermined sampling timing, the AD conversion controller includes a sampling timing pulse source that generates a pulse regulating the predetermined sampling timing and electrically controls a phase of the pulse, an error estimator that estimates sampling timing errors of the AD conversion of the digital signals based on a result of the AD conversion by the AD converter, a control-value calculating unit that calculates a control value for controlling the phase of the sampling timing pulse source based on the sampling timing errors estimated by the error estimator, and a compensator that performs feedback compensation of the phase of the pulse regulating the predetermined sampling timing based on the control value calculated by the control-value calculating unit.

According to another aspect of the present invention, an AD conversion controller that controls, in an optical receiving device receiving optical signals of which an optical intensity waveform of each symbol is an RZ pulse, an AD converter that converts received signals into digital signals by AD conversion at a predetermined sampling timing, the AD conversion controller includes a sampling timing pulse source that generates a pulse regulating the predetermined sampling timing, and electrically controls a phase of the pulse, a control-value calculating unit that estimates sampling timing errors of the AD conversion of the digital signals based on a result of the AD conversion by the AD converter, and calculates a control value for controlling the phase of the sampling timing pulse source based on the estimated sampling timing errors, and a compensator that performs feedback compensation of the phase of the pulse regulating the predetermined sampling timing based on the control value calculated by the control-value calculating unit.

According to still another aspect of the present invention, an AD conversion controller that controls, in an optical receiving device receiving optical signals of which an optical intensity waveform of each symbol is an RZ pulse, an AD converter that converts received optical signals into complex digital signals by AD conversion at a predetermined sampling timing, the AD conversion controller includes a sampling timing pulse source that generates a pulse regulating the predetermined sampling timing and electrically controls a phase of the pulse, a strength calculating unit that calculates an absolute value of the complex digital signals obtained as a result of the AD conversion by the AD converter or a value corresponding one-to-one with the absolute value of the complex digital signals, a control-value calculating unit that estimates, based on the absolute value of the complex digital signals or the value corresponding one-to-one with the absolute value of the complex digital signals calculated by the strength calculating unit, sampling timing errors of AD conversion of the complex digital signals, and calculates a control value for controlling the phase of the sampling timing pulse source based on the estimated sampling timing errors, and a compensator that performs feedback compensation of the phase of the pulse regulating the predetermined sampling timing based on the control value calculated by the control-value calculating unit.

According to still another aspect of the present invention, an optical receiving device for outputting received data, based on complex digital signals obtained as a result of AD conversion of received signals at a predetermined sampling timing, the received signals being generated based on optical signals of which an optical intensity waveform of each symbol is an RZ pulse, the optical receiving device includes a sampling timing pulse source that generates a pulse regulating the predetermined sampling timing and electrically controls a phase of the pulse, an AD converter that performs AD conversion of the received signals at the predetermined sampling timing, a control-value calculating unit that calculates an absolute value of the complex digital signals obtained as a result of the AD conversion by the AD converter or a value corresponding one-to-one with the absolute value of the complex digital signals, estimates sampling timing errors of the AD conversion of the complex digital signals, based on the calculated absolute value of the complex digital signals or the value corresponding one-to-one with the absolute value of the complex digital signals, and calculates a control value for controlling the phase of the sampling timing pulse source based on the estimated sampling timing errors, and a compensator that performs feedback compensation of the phase of the pulse regulating the predetermined sampling timing based on the control value calculated by the control-value calculating unit.

According to still another aspect of the present invention, an optical receiving method for outputting received data, based on complex digital signals obtained as a result of AD conversion of received signals at a predetermined sampling timing, the received signals being generated based on optical signals of which an optical intensity waveform of each symbol is an RZ pulse, the optical receiving method includes sampling timing pulse generating of generating a pulse regulating the predetermined sampling timing and electrically controlling a phase of the pulse, AD converting of performing AD conversion of the received signals at the predetermined sampling timing, strength calculating of calculating an absolute value of the complex digital signals obtained as a result of the AD conversion in the AD converting or a value corresponding one-to-one with the absolute value of the complex digital signals, error estimating of estimating sampling timing errors of the AD conversion of the complex digital signals, based on the absolute value of the complex digital signals or the value corresponding one-to-one with the absolute value of the complex digital signals calculated in the strength calculating, control value calculating of calculating a control value for controlling the phase of the pulse generated in the sampling timing pulse generating based on the estimated sampling timing errors, and compensating of performing feedback compensation of the phase of the pulse regulating the predetermined sampling timing based on the control value calculated in the control value calculating.

According to still another aspect of the present invention, a waveform-distortion compensating device that performs AD conversion to convert optically received signals into digital signals, compensates waveform distortion of the digital signals, and outputs resulting signals in an optical receiving device, the waveform-distortion compensating device includes a storage unit that stores therein for each waveform distortion status $d_i$ ($1 \leq i \leq m$) of m number ordered from 1 to m (m is a positive integer greater than 1), a combination of coefficients $C_{di\_1}$, $C_{di\_2}$ and so on up to $C_{di\_n}$ of n number for each waveform distortion status $d_i$, a selecting unit that selects in the order, one combination of coefficients from the storage unit, a waveform distortion compensating unit that compensates the waveform distortion of the digital signals, based on the one combination of the coefficients selected by the selecting unit, and a checking unit that checks whether a clock can be regenerated or not, based on a result of compensation by the waveform distortion compensating unit, wherein the selecting unit reselects a combination of subsequent coefficients $C_{d(j+1)\_(k+1)}$ ($1 \leq j \leq l-1$, k is a positive integer that satisfies $0 \leq k \leq n-1$) in the order, when a result of checking by the checking unit based on a combination of coefficients $C_{dj\_(k+1)}$ selected previously in the order indicates that the clock cannot be regenerated, and the waveform distortion compensating unit compensates, based on the combination of the coefficients $C_{d(j+1)\_(k+1)}$ reselected by the selecting unit, the waveform distortion of the digital signals.

The above and other objects, features, advantages and technical and industrial significance of this invention will be better understood by reading the following detailed description of presently preferred embodiments of the invention, when considered in connection with the accompanying drawings

DETAILED DESCRIPTION OF THE PREFERRED EMBODIMENTS

Exemplary embodiments of an AD conversion controller, an optical receiving device, an optical receiving method, and a waveform-distortion compensating device according to the present invention are explained in detail below with reference to the accompanying drawings. In a first and a second embodiment, optical communication is considered as a coherent optical communication and optical signals of the optical communication are considered as signals modulated by a return to zero multi-ary phase shift keying (RZ-mPSK) modulation format. The present invention is also applicable to a return to zero quadrature phase shift keying (RZ-QPSK) modulation format that is a subset of the RZ-mPSK modulation format. Without being restricted to the coherent optical communication, the present invention is applicable to the optical communication in general.

Without being restricted to the RZ-mPSK modulation format, the present invention is also applicable to other modulation formats such as return to zero multiple quadrature amplitude (RZ-mQAM), return to zero m-ary amplitude and phase shift keying (RZ-mAPSK), differential multiple phase shift keying (RZ-DmPSK), and return to zero on-off keying (RZ-OOK) when strength waveforms of an optical-symbol is return-to-zero (RZ) pulse. In other words, the present invention is applicable to other modulation formats combined with a modulation format RZ. Received signals received by an optical receiving device according to the present invention are called input signals.

Figure 1:
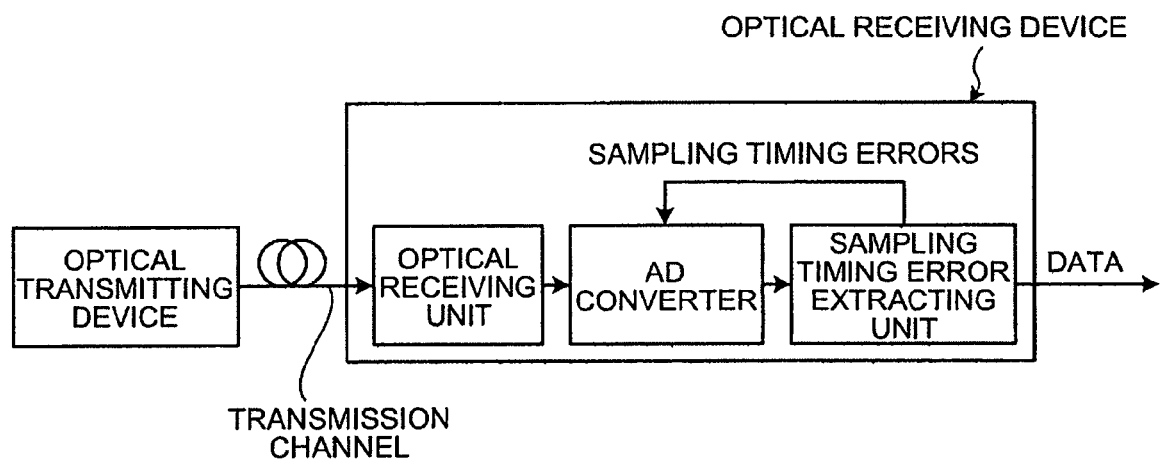
FIG. 1 is a diagram for explaining a general feature of the present invention.

Prior to explanation of the first and the second embodiment, salient features and an overview of the present invention are explained. FIG. 1 is a diagram for explaining a general feature of the present invention. As shown in FIG. 1, an optical transmitting device is facing an optical receiving device via a transmission channel of the optical communication. Optical signals modulated by the modulation format RZ-mPSK are transmitted from the optical transmitting device to the optical receiving device via the transmission channel. The optical transmitting device can use the modulation formats such as RZ-mQAM, RZ-mAPSK, RZ-DmPSK, and RZ-OOK other than the modulation format RZ-mPSK. Furthermore, the optical receiving device is considered as a digital coherent optical receiving device.

First, an optical receiving unit in the optical receiving device coherently receives the optical signals transmitted via the transmission channel from the optical transmitting device. By coherently receiving the optical signals, data in complex electric fields that include amplification and phase data of the received optical signals can be obtained. An analog to digital (AD) converter converts by a conversion process, the optical signals that are coherently received analog signals into complex digital signals. The details of the complex digital signals are explained later. The converted complex digital signals also inherit data of the complex electric fields.

A sampling timing error extracting unit subsequent to the AD converter performs digital processing on the complex digital signals thereby obtaining sampling timing errors. The sampling timing error extracting unit feeds back the obtained sampling timing errors to the AD converter. Thus, a sampling timing of the AD converter can be controlled such that the sampling timing will be an optimum timing.

In the present invention, it is presumed that a frequency of a local light that is used on receiving the optical signals from the optical transmitting device substantially matches with the frequency of the optical signals. To be specific, it is supposed that the frequency difference between the local lights and the optical signals is equal to or less than approximately 0.1 times the sampling frequency of the AD converter.

The first embodiment of the present invention is explained with reference to FIGS. 2 to 9 mentioned below. In the first embodiment, an operation is carried out such that a sampling of the AD conversion by the AD converter is performed basically once for one symbol of the optical signals from the RZ-mPSK optical transmitting device. In other words, a sampling rate of the AD conversion matches with a symbol rate of the optical signals.

Even if the operation is carried out such that the sampling rate of the AD conversion is n (n is a positive integer more than or equal to 2) times the symbol rate of the received signals received coherently and optically, a digital signal thinning unit not shown in the drawings may be provided in a control-value calculating unit 107. By temporally thinning the digital signals, the operation can be carried out similarly as when the sampling of the AD conversion is performed once for one symbol of the received signals received coherently and optically.

Figure 2:
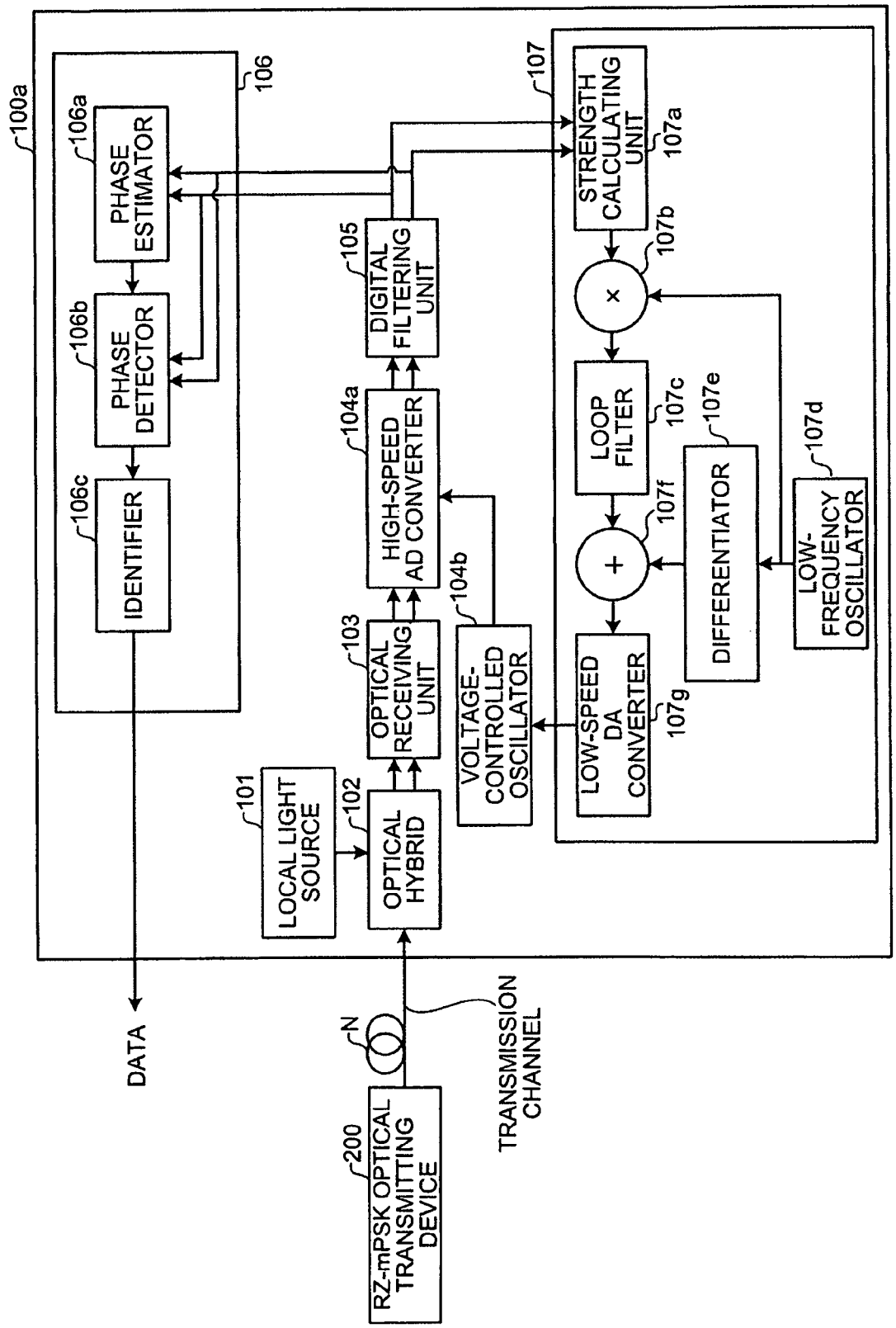
FIG. 2 is a functional block diagram of an optical receiving device according to a first embodiment.

A structure of the optical receiving device according to the first embodiment is explained first. FIG. 2 is a functional block diagram of the optical receiving device according to the first embodiment of the present invention. As shown in FIG. 2, an optical receiving device 100a receives from an RZ-mPSK optical transmitting device 200, for example, the RZ-mPSK modulated optical signals of approximately 20 giga-symbols per second (Gsymbol/s) via a transmission channel N. Apart from a transmission medium such as an optical fiber, a transmission channel N can include a wavelength multiplexer, a wavelength separator, an optical amplifier, an optical add-drop device, and a wavelength dispersion compensator.

The optical receiving device 100a according to the first embodiment includes a local light source 101, an optical hybrid 102, an optical receiving unit 103, a high-speed AD converter 104a and a voltage-controlled oscillator 104b, a digital filtering unit 105, a data regenerator 106, and the control-value calculating unit 107.

The local light source 101 is a local oscillator that emits the optical signals serving as a reference (hereinafter, "reference optical signals") and provides to the optical hybrid 102, the reference optical signals for mixing with the optical signals received from the RZ-mPSK optical transmitting device 200.

The optical hybrid 102 mixes the reference optical signals from the local light source 101 with the optical signals received from the RZ-mPSK optical transmitting device 200 and outputs a plurality of optical signals including amplitude data and phase data included in the received optical signals. There are various types of optical hybrids. For example, a general 90-deg optical hybrid outputs an In-phase component (I component) that is obtained by mixing the received optical signals and the reference optical signals without delaying a phase of the reference optical signals and a Quadrature-phase component (Q component) obtained by mixing the optical signals and the reference optical signals by delaying the phase of the reference optical signals by 90 degrees.

In addition to the 90-deg optical hybrid, a 120-deg optical hybrid can be used as the optical hybrid. The 120-deg optical hybrid is described in, for example, "K. Emura et al., "5 Gbit/s Optical Phase Diversity Homodyne Detection Experiment", Electronics Letters Vol. 25, Year 1989".

The optical receiving unit 103 receives the plurality of optical signals output from the optical hybrid 102, converts the received optical signals into analog electric signals, and distributes to the high-speed AD converter 104a. For example, when the 90-deg optical hybrid is used, complex analog electric signals corresponding to the I components and the Q components are obtained. In the sampling timing regulated based on a high-speed clock provided from the voltage-controlled oscillator 104b, the high-speed AD converter 104a converts the complex analog electric signals including the amplitude and phase data of the optical signals distributed from the optical receiving unit 103 into complex digital electric signals. The complex analog electric signals including the amplitude and phase data of the optical signals are converted into the complex digital signals. The complex digital signals including the amplitude and phase data of the optical signals are distributed to the digital filtering unit 105.

An AD converter is formed as a combination of the high-speed AD converter 104a and the voltage-controlled oscillator 104b.

The digital filtering unit 105 compensates waveform distortion of the complex digital signals converted by the high-speed AD converter 104a and equalizes the distortion of signal waveforms occurred during the propagation in the transmission channel N. The waveform distortion can be classified into linear waveform distortion that occurs due to wavelength dispersion, primary polarization mode dispersion, and the like, and non-linear waveform distortion that occurs due to self phase modulation (SPM), high-order polarization mode dispersion, and the like.

The digital filtering unit 105 can be a linear filter or a non-linear filter or can be a combination of the linear and the non-linear filter. Even a most simple linear filter can compensate not only the linear waveform distortion that occurs due to the wavelength dispersion or the primary polarization mode dispersion but also the non-linear waveform distortion that occurs due to the SPM and the high-order polarization mode dispersion to some extent. The fact that the linear filter has distortion compensation effects with respect to the non-linear waveform distortion is described, for example, in "J. H. Winters et al., "Electrical Signal Processing Techniques in Long-Haul Fiber-Optics Systems", IEEE Transactions on communications Vol. 38 No. 9, Year 1990".

In the first embodiment, the digital filtering unit 105 may include a finite impulse response (FIR) type, an infinite impulse response (IIR) type, and a maximum likelihood sequence estimation (MLSE) type. The complex digital signals of which the waveform distortion is compensated by the digital filtering unit 105 are distributed to the data regenerator 106 and the control-value calculating unit 107, respectively.

The digital filtering unit 105 compensates the waveform distortion of the complex digital signals converted by the high-speed AD converter 104a by digital processing performed by a digital processor. The waveform distortion can be compensated flexibly without the need of an additional, complex circuit structure.

Upon receiving the complex digital signals of which the waveform distortion is compensated, the data regenerator 106 regenerates data based on the phase of the complex digital signals. A method disclosed in Satoshi Tsukamoto, Yuta Ishikawa, and Kazuro Kiuchi, "Optical Homodyne Receiver Comprising Phase and Polarization Diversities with Digital Signal Processing", European Conference On Optical Communication 2006, Year 2006 can be used as a data regenerating method.

The data regenerator 106 further includes a phase estimator 106a, a phase detector 106b, and an identifier 106c. By the data regenerating method disclosed in Satoshi Tsukamoto, Yuta Ishikawa, and Kazuro Kiuchi, "Optical Homodyne Receiver Comprising Phase and Polarization Diversities with Digital Signal Processing", European Conference On Optical Communication 2006, Year 2006, the phase estimator 106a calculates phase errors of the complex digital signal including the I component and the Q component transferred from the digital filtering unit 105. To be specific, by raising the complex digital signals to the power of m, a modulated portion of the phase by the RZ-mPSK modulation is canceled and only the phase errors are left. Here, "m" of the "m power" is "m" of the RZ-mPSK and "RZ-mPSK" is PSK of an m phase. The phase errors are transferred to the phase detector 106b.

The phase detector 106b receives the complex digital signals from the digital filtering unit 105 and the phase errors from the phase estimator 106a. The phase detector 106b deducts the phase errors transferred from the phase estimator 106a from the complex digital signals distributed from the digital filtering unit 105 to cancel a phase error component attributable to the phase difference between the received optical signals and the local light source 101 from the complex digital signals. The phase of the complex digital signals of which the phase difference is canceled is transferred to the identifier 106c. The MLSE may be arranged between the phase detector 106b and the identifier 106c.

Upon receiving the complex digital signals of which the phase errors are canceled, the identifier 106c identifies data conveyed by the optical signals based on the complex digital signals of which the phase errors are canceled.

In the data regenerator 106, if the optical intensity waveform of each symbol is a return-to-zero (RZ) pulse, even if the modulation format is other than RZ-mPSK, the operation can be performed in a similar way by appropriately changing a layout according to the modulation format as described in, for example, "M. Nakazawa and others, "20 Msymbol/s, 128 QAM Coherent Optical Transmission over 500 km Using Heterodyne Detection with Frequency-stabilized Laser", Mo.4.2.2. ECOC2006, Year 2006" with respect to the RZmQAM modulation format. Furthermore, the operation can be performed in an RZ-DmPSK modulation format that uses the phase difference of immediately preceding symbols and carries out encoding. A decoder that detects a difference between the symbols can be provided in the identifier 106c. Units other than the data regenerator 106c, in particular, the control-value calculating unit 107 can naturally operate in the modulation format other than RZ-mPSK as far as the optical intensity waveform of each symbol is the RZ pulse.

On receiving the complex digital signals of which the waveform distortion is compensated, the control-value calculating unit 107 calculates a control value based on an absolute value of the complex digital signals or a value that corresponds one-to-one with the absolute value of the complex digital signals, and provides a control signal for controlling the clock provided by the voltage-controlled oscillator 104b to the high-speed AD converter 104a based on the calculated control value.

The control-value calculating unit 107 further includes a strength calculating unit 107a, a multiplier 107b, a loop filter 107c, a low-frequency oscillator 107d, a differentiator 107e, an adder 107f, and a low-speed digital-to-analog (DA) converter 107g.

The strength calculating unit 107a calculates the absolute value of the complex digital signals of which the waveform distortion is compensated by the digital filtering unit 105 or the value (hereinafter, called "strength") that corresponds one-to-one with the absolute value of the complex digital signals and transfers the calculated value to the multiplier 107b. For example, in the 90-deg optical hybrid, the strength can be a square sum or a positive square root of the I component and the Q component.

The low-frequency oscillator 107d generates dithering signals of several mega hertz (MHz). The dithering signals can be in a rectangular waveform, a sine waveform, a triangular waveform, or a saw-tooth waveform. The dithering signals are distributed to the multiplier 107b and mixed with the strength transferred from the strength calculating unit 107a. A result obtained after mixing the strength and the dithering signals and averaging over an appropriate period of time is a value corresponding to signed errors related to the sampling timing of the AD conversion. For example, a positive result indicates that the phase of the sampling timing of the AD conversion is at a position delaying from an optimum point. A negative result indicates that the phase of the sampling timing of the AD conversion is at the position leading from the optimum point. A zero result indicates that the phase of the sampling timing of the AD conversion is at the position of the optimum point.

The result obtained upon mixing the strength and the dithering signals is passed through the loop filter 107c and transferred to the adder 107f. A processing example of the loop filter 107c is indicated in an expression shown below.

$$\text{Error signals of sampling timing} = \int (\text{Dithering Signal}) \times \text{AC}(\text{Response Signal}) dt \quad (1)$$

In the expression (1) above, integration represents the averaging over the predetermined period of time. The "Dithering Signal" represents the dithering signals and "AC(Response Signal)" represents an alternating current component of the response signals with respect to the dithering signals. The loop filter 107c is a design factor that determines a response of a feedback loop that goes through the control-value calculating unit 107 and the voltage-controlled oscillator 104b from the high-speed AD converter 104a and returns to the high-speed AD converter 104a. Other than the averaging process indicated in the expression (1), the loop filter 107c may include a proportional-integral-derivative (PID) algorithm and the like.

The dithering signals oscillated by the low-frequency oscillator 107d are also distributed to the differentiator 107e. The differentiator 107e is a differentiating device. The adder 107f adds the dithering signals differentiated by the differentiator 107e and the signals output from the loop filter 107c. The adder 107f is an adding device. In other words, by adding the dithering signals to the result processed by the loop filter 107c, control signals to be provided to the voltage-controlled oscillator 104b are calculated.

A method of calculating the error signals of the sampling timing by using the multiplier 107b and the loop filter 107c mentioned earlier is based on a commonly used technology called homodyne detection.

The low-speed DA converter 107g DA converts in a speed of, for example, multimillion samples per second, the control signals that are output from the adder 107f and are to be provided to the voltage-controlled oscillator 104b. A control voltage obtained upon DA conversion is supplied to the voltage-controlled oscillator 104b. The voltage-controlled oscillator 104b is a clock generating source in which an oscillation frequency changes based on the supplied control voltage. The voltage-controlled oscillator 104b generates the clock that regulates the sampling timing of the high-speed AD converter 104a. If the control voltage supplied to the voltage-controlled oscillator 104b is appropriately controlled, the phase of the generated clock can also be controlled which is self-evident to those skilled in the art. The clock that regulates the sampling timing generated by the voltage-controlled oscillator 104b is approximately 20 MHz that is nearly equal to the symbol rate of the received signals.

The control-value calculating unit 107 calculates by the digital processing performed by the digital processor, the control voltage of the clock regulating the sampling timing to be provided to the high-speed AD converter 104a. An entirety or a major portion of the control-value calculating unit 107 can be integrated and mounted on the same digital integrated circuit together with the digital filtering unit 105 and the data regenerator 106. Thus, there is no need of additional complex analog circuit element and downsizing and reduced power consumption can be realized.

In the first embodiment, a structure is presumed in which the optical receiving unit 103 that performs photoelectric conversion is provided between the optical hybrid 102 and the high-speed AD converter 104a. However, as an alternative structure, the optical receiving unit 103 can be provided subsequent to the optical region in which the sampling function of the high-speed AD converter 104a is realized. As an element for implementing the sampling function in the optical region, an electro-absorption (EA) modulator using a semiconductor and an all-optical switch using a non-linear optical element can be used. When the all-optical switch is used, it is necessary for the voltage-controlled oscillator 104b to use an optical pulse train source such as mode locked semiconductor laser. In such configuration, the sampling can be performed in the optical region even if the processing speed does not allow the sampling in the electric circuit.

Figure 3:
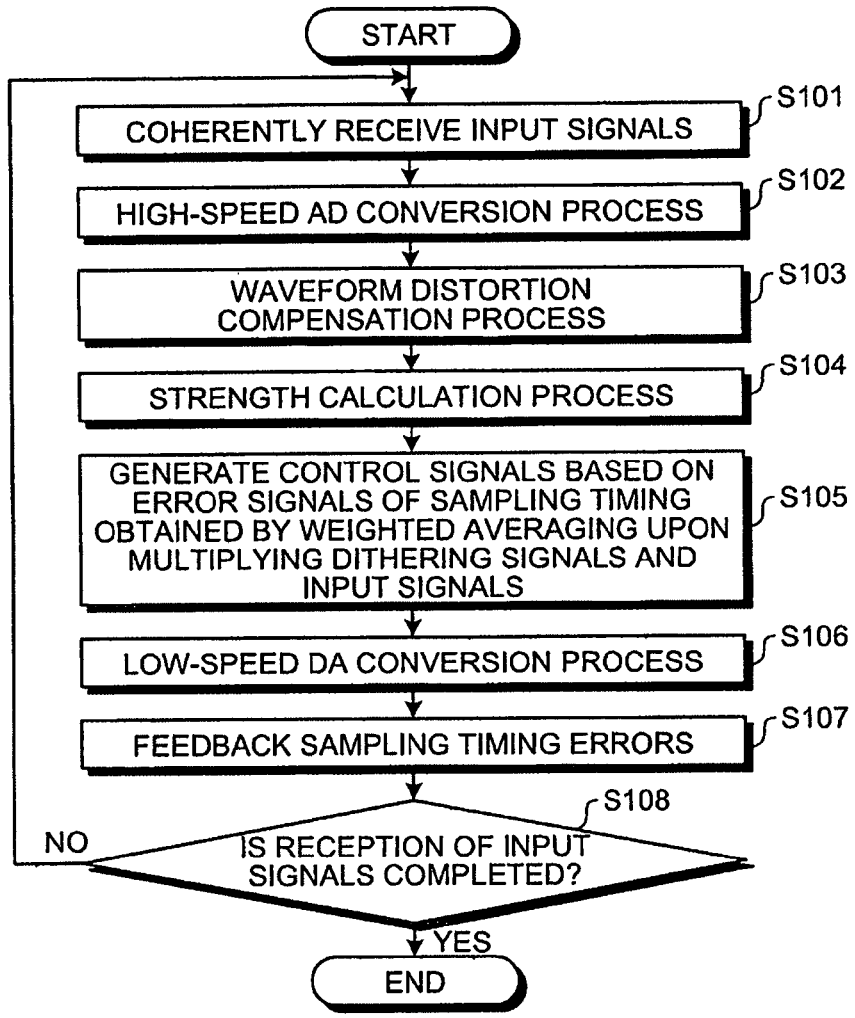
FIG. 3 is a flowchart of an AD conversion control procedure according to the first embodiment.

An AD conversion control process executed by the optical receiving device 10a according to the first embodiment shown in FIG. 2 is explained next. FIG. 3 is a flowchart of one example of the AD conversion control procedure according to the first embodiment. In the AD conversion control, the clock is controlled that is provided from the voltage-controlled oscillator 104b to the high-speed AD converter 104a and that generates the sampling timing.

First, the optical receiving unit 103 of the optical receiving device 10a coherently receives input signals from the RZ-mPSK optical transmitting device 200 (step S101). The high-speed AD converter 104a converts the analog signals upon coherently receiving the input signals at step S101 into the complex digital signals (step S102). The digital filtering unit 105 electrically compensates the waveform distortion of the converted complex digital signals (step S103).

The strength calculating unit 107a calculates the strength of the complex digital signals of which the waveform distortion is electrically compensated by the digital filtering unit 105 (step S104). Based on the value obtained by multiplying the dithering signals and the input signals, the multiplier 107b, the loop filter 107c, and the adder 107f obtain the error signals of the sampling timing, and based on the obtained error signals, generate the control signals to be provided to the voltage-controlled oscillator 104b (step S105).

The low-speed DA converter 107g performs the DA conversion on the control signals (step S106) and supplies the control voltage to the voltage-controlled oscillator 104b (step S107). A controller of the optical receiving device 100a determines whether the cessation of the reception of the optical input signals means the completion of the reception of input signal or not (step S108). If the reception of the input signals is completed (Yes at step S108), the AD conversion control process ends and if reception of the input signals is not completed (No at step S108), the controller proceeds to step S101.

Figure 4:
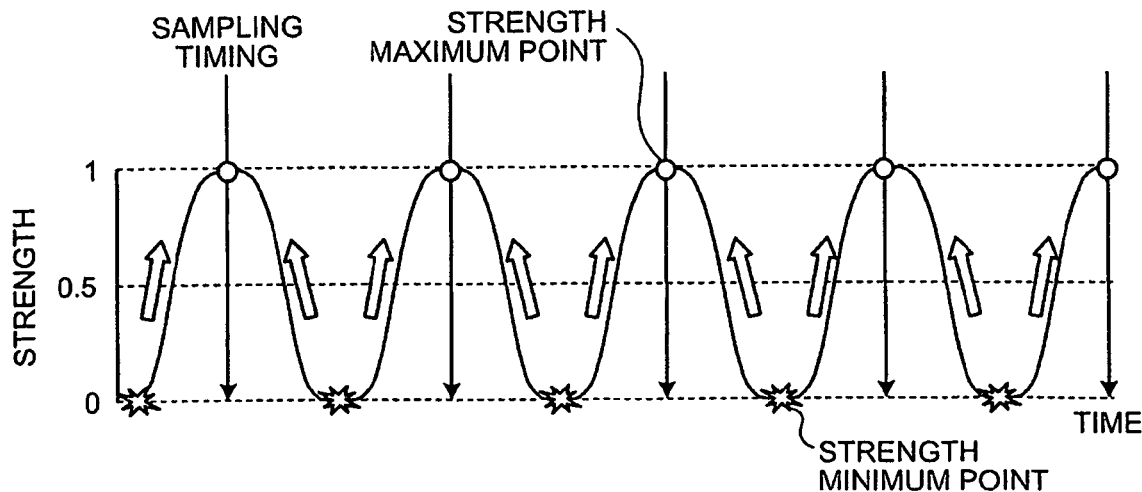
FIG. 4 is a schematic for explaining an overview of phase synchronization between an AD conversion timing and input signals according to the first embodiment.

Phase synchronization between the sampling timing of the AD conversion and the input signals by the high-speed AD converter 104a is explained next. FIG. 4 is a schematic for explaining an overview of the phase synchronization between the AD conversion timing and the input signals according to the first embodiment. As shown in FIG. 4, a vertical axis represents the strength and a horizontal axis represents a time. While the strength of the input signals changes over time, the input signals are sampled at a predetermined timing.

The strength has a waveform, for example, a raised-cosine waveform on which the optical intensity waveform of the received optical signals is reflected. While sampling the signals for regenerating data that is included in the input signals, sampling the signals in a vicinity of a peak of the strength is desirable. When the modulation format is RZ-mPSK, a strength peak value of an incoming RZ pulse is basically constant, as shown in FIG. 4. When the modulation format is RZ-mQAM or RZ-mAPSK, the strength peak value of the RZ pulse changes based on data included in each symbol. In any modulation format, the similar operation can be performed according to the explanation below.

Thus, it is preferable that the position of the sampling timing is close to a maximum point of the strength as far as possible. When the sampling timing is on the left side of the maximum point of the strength (early in terms of time), a feedback control is performed such that the sampling timing is delayed and when the sampling timing is on the right side of the maximum point of the strength (delayed in terms of time), a clock phase of the sampling timing is advanced. Thus, the feedback control is performed such that the sampling timing is close to the maximum point of the strength.

Figure 5A:
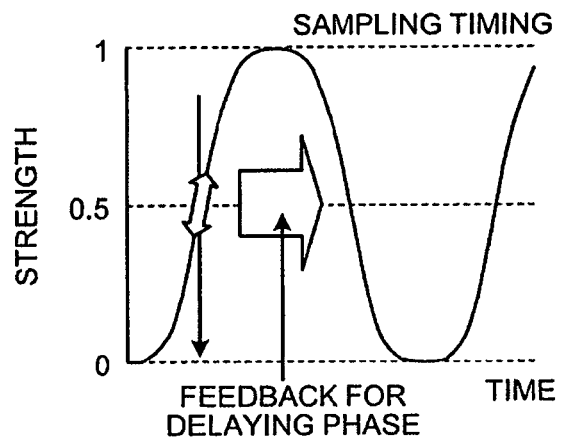
FIG. 5A is a schematic for explaining the overview of the phase synchronization (when a feedback is generated for delaying a phase) between the AD conversion timing and the input signals according to the first embodiment.

The feedback control of the sampling timing is explained in detail with reference to FIGS. 5A, 5B, and 5C. FIG. 5A is a schematic which shows a case where the sampling timing of the AD conversion regulated by the clock according to the first embodiment is leading (phase is leading) the timing when the strength of the input signal symbol is maximum. As shown in FIG. 5A, when the sampling timing is on the left side of the maximum point of the strength, the feedback control is performed such that the clock phase of the sampling timing is delayed. The value of the error signals of the sampling timing calculated in the expression (1) is negative.

Figure 5B:
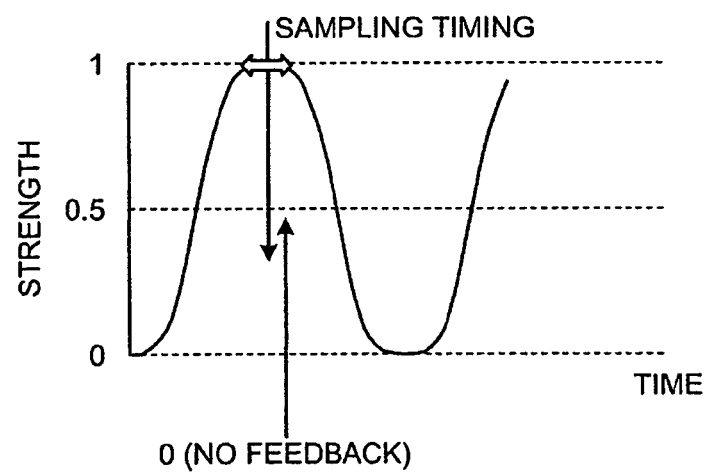
FIG. 5B is a schematic for explaining the overview of the phase synchronization (when the phase is maintained in a present state) between the AD conversion timing and the input signals according to the first embodiment.

FIG. 5B is a schematic which shows a case where the sampling timing of an AD conversion regulated by the clock according to the first embodiment matches with the sampling timing when the strength of the symbol of the input signals is maximum. As shown in FIG. 5B, the clock phase of the sampling timing is maintained when the sampling timing is at the maximum point of the strength. Here, the error signals of the sampling timing calculated in the expression (1) are zero.

Figure 5C:
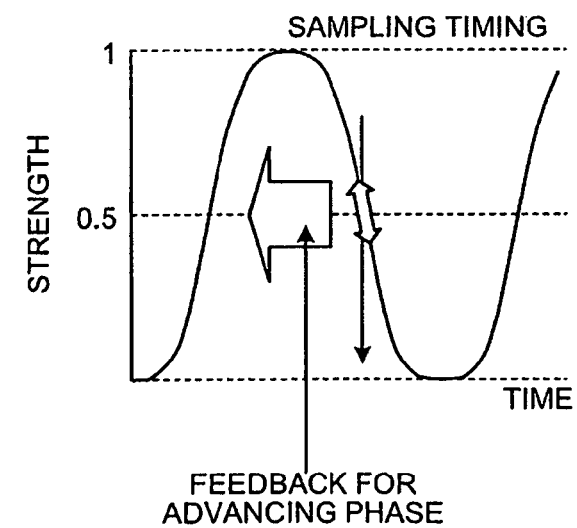
FIG. 5C is a schematic for explaining the overview of the phase synchronization (when the feedback is generated for leading the phase) between the AD conversion timing and the input signals according to the first embodiment.

FIG. 5C is a schematic which shows a case where the sampling timing of the AD conversion timing regulated by the clock according to the first embodiment is delayed (phase is delayed) than the sampling timing when the strength of the symbol of the input signals is maximum. As shown in FIG. 5C, when the sampling timing is on the right side of the maximum point of the strength, the feedback control is performed such that the clock phase of the sampling timing is advanced. The value of the error signals of the sampling timing calculated in the expression (1) is positive.

When the sampling timing is at the minimum point of the strength, the error signals of the sampling timing calculated in the expression (1) are zero. Thus, the clock phase of the sampling timing is maintained. However, when the sampling point shifts even slightly because of circuit noises or the like, the feedback is controlled such that the sampling timing moves away from the point. Therefore, the sampling would not be performed on the minimum point of the strength for an extended period of time.

Figures 6, 7:
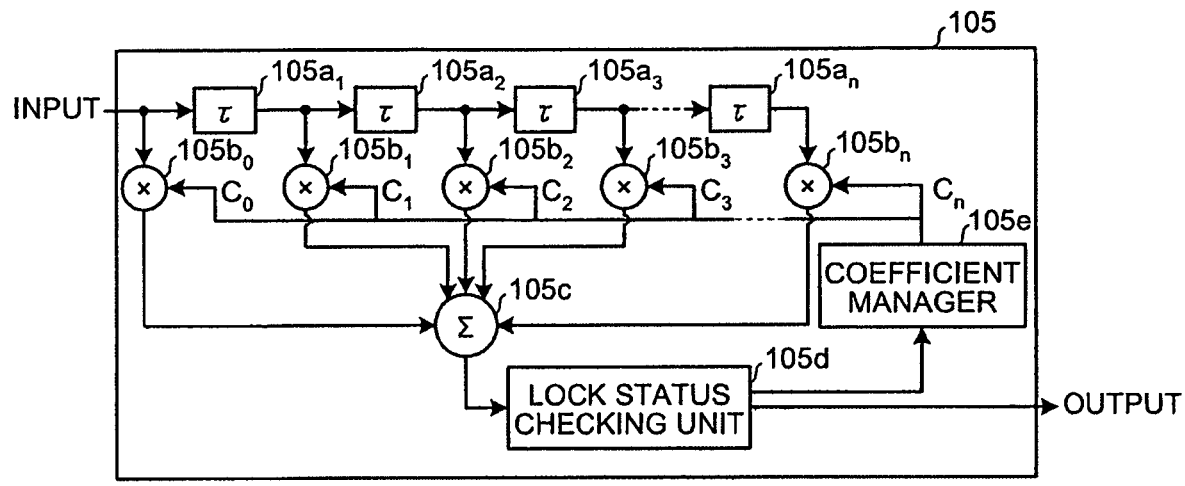
FIG. 6 is a functional block diagram of a digital filtering unit according to the first embodiment.
FIG. 7 is an example of a coefficient storage table.

A structure of the digital filtering unit 105 shown in FIG. 2 is explained next. FIG. 6 is a functional block diagram of an example of the digital filtering unit 105 shown in FIG. 2. As shown in FIG. 6, the digital filtering unit 105 includes delay units $105a_1$, $105a_2$ and so on up to $105a_n$ of n (n is a positive integer) number, multipliers $105b_0$, $105b_1$, $105b_2$ and so on up to $105b_n$ of (n+1) (n is the positive integer) number, an adder 105c, a lock status checking unit 105d, and a coefficient manager 105e.

The delay units $105a_1$, $105a_2$ and so on up to $105a_n$ cause the input signals to delay by a time period τ. The delay unit $105a_1$ distributes the input signals delayed by the time period τ to the delay unit $105a_2$ and the multiplier $105b_1$. Similarly, the delay unit $105a_2$ distributes the input signals further delayed by the time period τ to the delay unit $105a_3$ and the multiplier $105b_2$. Similarly, a delay unit $105a_{n-1}$ distributes the input signals delayed by a time period (n−1)×τ to the delay unit $105a_n$ and the multiplier $105b_{n-1}$. In brief, a delay unit $105a_i$ (i is a positive integer that satisfies 1≦i≦n−1) distributes to a delay unit $105a_{i+1}$ and a multiplier $105b_i$, the input signals supplied to the digital filtering unit 105 and delayed by a time period i×τ. Furthermore, the delay unit $105a_n$ (n is the positive integer) distributes to the multiplier $105b_n$, the input signals supplied to the digital filtering unit 105 and delayed by a time period n×τ.

The multiplier $105b_0$ multiplies by a coefficient $C_0$, the input signals those are not delay processed and transfers a result to the adder 105c. The multiplier $105b_1$ multiplies the input signals delayed by the time period τ by a coefficient $C_1$ and transfers the result to the adder 105c. The multiplier $105b_2$ multiplies the input signals delayed by a time period 2τ by a coefficient $C_2$ and transfers the result to the adder 105c. Similarly, the multiplier $105b_n$ multiplies the input signals delayed by the time period n×τ by a coefficient $C_n$ and transfers the result to the adder 105c.

The coefficients $C_0$ to $C_n$ are a set of weighting coefficients those are associated with a waveform distortion status of the input signals, for example, an accumulated wavelength dispersion amount with respect to the signals of the transmission channel N. The coefficients $C_0$ to $C_n$ associated with each waveform distortion status are ordered according to a specific order decided by a designer and are managed in the coefficient manager 105e. The coefficient manager 105e stores in a table and manages, the coefficients associated with each waveform distortion status. The table storing the coefficients is indicated in FIG. 7.

In the example of the coefficient storage table shown in FIG. 7, $C_0=C_{0\_m10}$, $C_1=C_{1\_m10}$ and so on up to $C_n=C_{n\_m10}$ are associated with the waveform distortion status corresponding to the accumulated wavelength dispersion −1000 picoseconds/nanometer (ps/nm) and stored. Furthermore, $C_0=C_{0\_m09}$, $C_1=C_{1\_m09}$ and so on up to $C_n=C_{n\_m09}$ are associated with the accumulated wavelength dispersion −900 ps/nm and stored. Further, $C_0=C_{0\_o00}$, $C_1=C_{1\_o00}$ and so on up to $C_n=C_{n\_o00}$ are associated with the accumulated wavelength dispersion 0 ps/nm and stored. Further, $C_0=C_{0\_p09}$, $C_1=C_{1\_p09}$ and so on up to $C_n=C_{n\_p09}$ are associated with the accumulated wavelength dispersion 900 ps/nm and stored. Further, $C_0=C_{0\_p10}$, $C_1=C_{1\_p10}$ and so on up to $C_n=C_{n\_p10}$ are associated with the accumulated wavelength dispersion 1000 ps/nm and stored.

In the example of the coefficient storage table shown in FIG. 7, a combination of the coefficients associated with certain waveform distortion status includes elements of (n+1) of $C_0$ to $C_n$. The elements of (n+1) of $C_0$ to $C_n$ are used as a set of coefficients when the digital filtering unit 105 includes the delay units $105a_1$ and so on up to $105a_n$ of n number and the multipliers $105b_0$ and so on up to $105b_n$ of (n+1) number. For example, when the digital filtering unit 105 includes four delay units $105a_1$ and so on up to $105a_4$ and five multipliers $105b_0$ and so on up to $105b_4$, n=4. The coefficient storage table stores therein $C_0=C_{0\_m10}$, $C_1=C_{1\_m10}$ and so on up to $C_4=C_{4\_m10}$ with respect to the accumulated wavelength dispersion −1000 ps/nm, $C_0=C_{0\_m09}$, $C_1=C_{1\_m09}$ and so on up to $C_4=C_{4\_m09}$ with respect to the accumulated wavelength dispersion −900 ps/nm, $C_0=C_{0\_o00}$, $C_1=C_{1\_o00}$ and so on up to $C_4=C_{4\_o00}$ with respect to the accumulated wavelength dispersion 0 ps/nm, $C_0=C_{0\_p09}$, $C_1=C_{1\_p09}$ and so on up to $C_4=C_{4\_p09}$ with respect to the accumulated wavelength dispersion 900 ps/nm, and $C_0=C_{0\_p10}$, $C_1=C_{1\_p10}$ and so on up to $C_4=C_{4\_p10}$ with respect to the accumulated wavelength dispersion 1000 ps/nm.

The coefficient storage table stores therein the coefficients that are experimentally or logically derived in advance such that the waveform distortion assumed in each waveform distortion status is roughly compensated.

Returning to FIG. 6, the coefficient manager 105e outputs to the multipliers $105b_0$ and so on up to $105b_n$, the set of coefficients corresponding to the waveform distortion status that corresponds to an initial status decided in advance at the time of designing. The adder 105c adds all outputs of the multipliers $105b_0$ and so on up to $105b_n$. When a clock regeneration lock status check result is "lock disapproved" in the lock status checking unit 105d, in other words, when it is determined that the status of the regenerated clock is not within a predetermined range in a predetermined period of time, the coefficient manager 105e outputs the coefficients associated with the waveform distortion status that is ordered next to the initial status of the waveform distortion status. The coefficient manager 105e sequentially outputs in the order of the waveform distortion status, the set of the corresponding coefficients until the check result in the lock status checking unit 105d becomes "locked". The lock status can be checked not only by a method mentioned earlier, but also by various methods.

Figure 8:
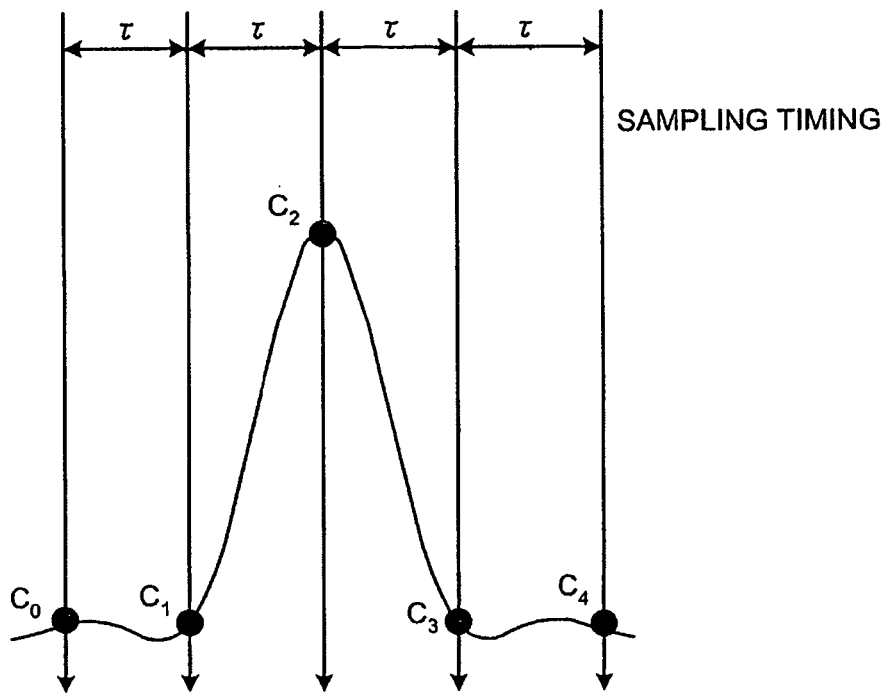
FIG. 8 is a schematic for explaining a relation between a coefficient and an impulse response of the digital filtering unit.

A relation between the output signals output from the digital filtering unit 105 shown in FIG. 6 and the coefficient is explained. FIG. 8 is a schematic for explaining an example of a relation between the coefficient and an impulse response of the digital filtering unit 105. In FIG. 8, it is assumed that n=4. The impulse response is a response signal output from the digital filtering unit 105 when an impulse is input.

As shown in FIG. 8, first, the impulse that is not delayed is multiplied by the coefficient $C_0$, the impulse that is delayed by the time period τ is multiplied by the coefficient $C_1$, the impulse delayed by the time period τ is multiplied by $C_2$, the impulse delayed by the time period τ is multiplied by the coefficient $C_3$, and the impulse delayed by the time period τ is multiplied by the coefficient $C_4$. Furthermore, all the multiplication results are added. As shown in FIG. 8, a resulting impulse response sets the sampling timing at every time interval of time τ.

Thus, the digital filtering unit 105 can compensate the waveform distortion of the input signals by a process performed by the digital processor, thereby enabling to compensate the waveform distortion in a simple structure. With the coefficient storage table corresponding to a predictable waveform distortion status, even if the optical signals from the transmission channel N that has not been transitioned to an adaptive control by the coefficient are received for the first time, the waveform distortion can be rapidly compensated and a time the communication is cut can be significantly shortened.

Figure 9:
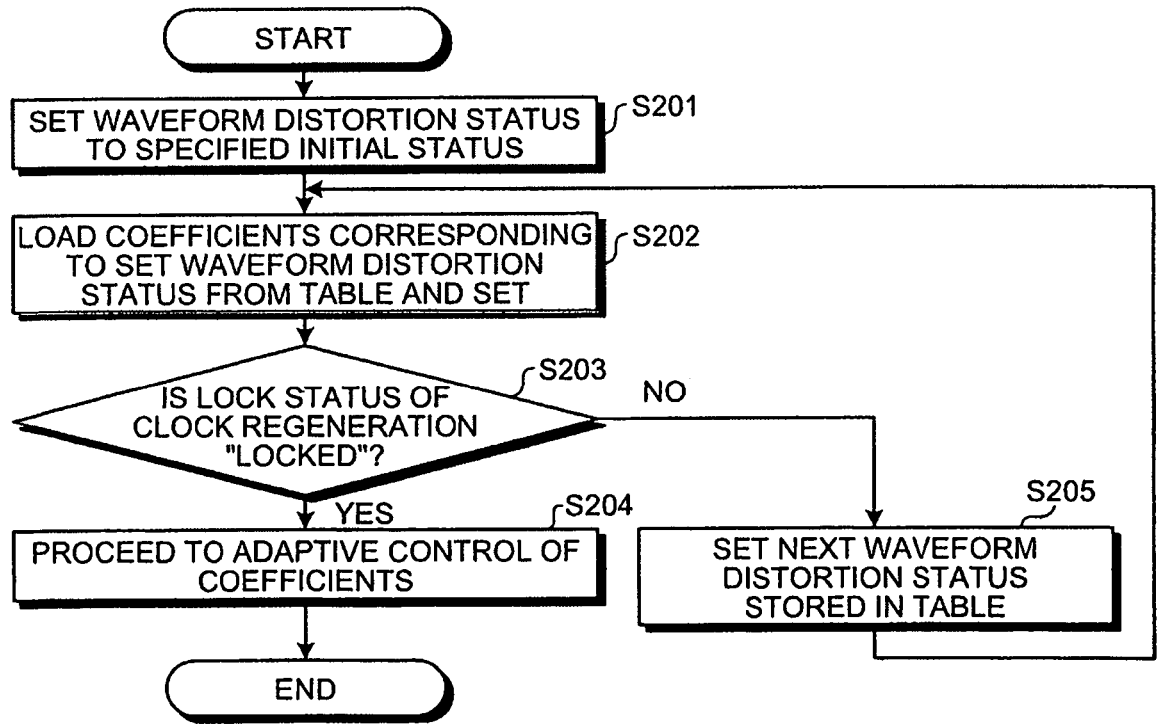
FIG. 9 is a flowchart of a digital filtering initial procedure performed by the digital filtering unit.

An initial digital filtering process that is executed by the digital filtering unit 105 shown in FIG. 6 is explained next. FIG. 9 is a flowchart of an example of an initial digital filtering procedure performed by the digital filtering unit 105. The initial digital filtering process is a process for deciding the coefficients for compensating the waveform distortion of the input signals, when the input signals are received for the first time.

First, the coefficient manager 105e of the digital filtering unit 105 sets the waveform distortion status to a specified initial status (step S201). The coefficient manager 105e loads the coefficients corresponding to the set waveform distortion status from the coefficient storage table and sets in the multipliers $105b_0$ and so on up to $105b_n$ (step S202).

The lock status checking unit 105d determines whether a clock regeneration lock status is "locked" (step S203). If the clock regeneration lock status is "locked" (Yes at step S203), the coefficient manager 105e and the lock status checking unit 105d proceed to an adaptive control of the coefficients (step S204).

According to this procedure, after the rough waveform distortion compensation is established, a more precise waveform compensation can be performed by calculating the coefficients suitable for the actual waveform distortion status of the actually received signals using a specific algorithm. Furthermore, even if the waveform distortion status is changed based on the changes in the status of the transmission channel N, the waveform distortion compensation can be continued by the adaptive control of the waveform distortion compensation.

When the clock regeneration lock status is not "locked" (No at step S203), the coefficient manager 105e sets a next waveform distortion status of the coefficient storage table (step S205) and proceeds to step S202.

In the example above, an instance is explained when as a structure of a digital filter, a feed-forward equalizer (FFE) type that is a type of the FIR type filter is adopted. However, a different type of filter can be employed as far as its properties can be adjusted by combination of coefficients.

A second embodiment of the present invention is explained with reference to FIGS. 10 to 13D. In the second embodiment, the operation is carried out such that the sampling of the AD conversion by the AD converter is basically performed twice on one symbol of the optical signals from the RZ-mPSK optical transmitting device. Without being restricted to RZ-mPSK, the modulation format of the optical transmitting device can be RZ-mQAM, RZ-mAPSK, or RZ-DmPSK. Here, the sampling rate of the AD conversion is two times the symbol rate of the optical signals. Other than that, the second embodiment is similar to the first embodiment. The optical receiving device according to the second embodiment is presumed as a digital coherent optical receiving device.

Even if the ratio of the sampling rate of the AD conversion to the symbol rate of the optical signals received optically and coherently is n (n is the positive integer more than or equal to 2), by temporally thinning the digital signals by an appropriate method in a later explained demultiplexer (demux) 108b, the operation is carried out nearly similar to the operation performed when the sampling of the AD conversion is performed twice on one symbol of the received signals received coherently and optically.

Figure 10:
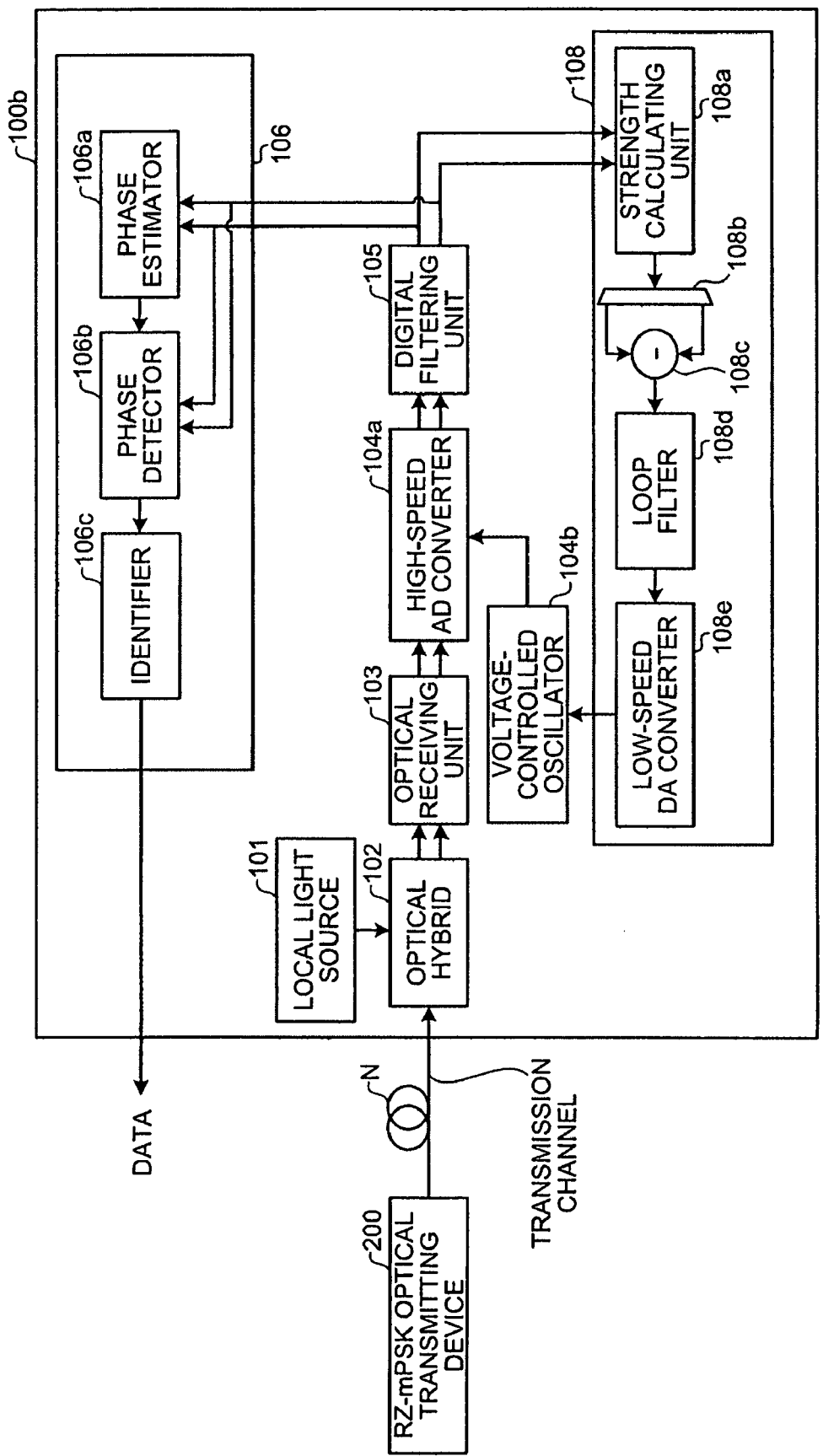
FIG. 10 is a functional block diagram of an optical receiving device according to a second embodiment.

A structure of the optical receiving device according to the second embodiment is explained first. FIG. 10 is a functional block diagram of the optical receiving device according to the second embodiment of the present invention. An optical receiving device 100b according to the second embodiment is nearly the same as the optical receiving device 100a according to the first embodiment. Thus, with reference to FIG. 10, only points differing from the optical receiving device 10a according to the first embodiment are explained.

The optical receiving device 100b according to the second embodiment includes the local light source 101, the optical hybrid 102, the optical receiving unit 103, the high-speed AD converter 104a and the voltage-controlled oscillator 104b, the digital filtering unit 105, the data regenerator 106, and a control-value calculating unit 108. The local light source 101, the optical hybrid 102, the optical receiving unit 103, the high-speed AD converter 104a and the voltage-controlled oscillator 104b, the digital filtering unit 105, and the data regenerator 106 are similar to those in the optical receiving device 100a according to the first embodiment, and therefore, the explanation thereof will not be repeated.

The control-value calculating unit 108 further includes a strength calculating unit 108a, the demux 108b, a subtracter 108c, a loop filter 108d, and a low-speed DA converter 108e.

Because the strength calculating unit 108a is similar to the strength calculating unit 107a according to the first embodiment, the explanation thereof is not repeated. The demux 108b separates the strength calculated by the strength calculating unit 108a into the strength (hereinafter, called "first strength") obtained by performing initial sampling in one symbol of the input signals and the strength (hereinafter, called "second strength") obtained from the subsequent sampling. The subtracter 108c deducts the second strength from the first strength. The loop filter 108d carries out a predetermined calculation, for example, an averaging process with respect to the input signals. A band of the output signals of the loop filter 108d is less than or equal to several MHz. The example of the averaging process executed by the loop filter 108d is represented by an expression 2.

Error signals of sampling timing = (2)

$$\frac{1}{N}\sum_{n=1}^{N}\{(I_{2n-1}^2 + Q_{2n-1}^2) - (I_{2n}^2 + Q_{2n}^2)\}$$

In the expression (2), if "fvco" is considered as the frequency of the voltage-controlled oscillator 104b, N/fvco corresponds to the predetermined time period mentioned earlier during which the loop filter 108d carries out the averaging process. The error signals of the sampling timing are obtained via the averaging process over the predetermined period of time in the loop filter 108d. The loop filter 108d is a design factor that determines a response of a feedback loop that goes through the control-value calculating unit 108 and the voltage-controlled oscillator 104b from the high-speed AD converter 104a and returns to the high-speed AD converter 104a. Other than the averaging process indicated in the expression (2), the loop filter 108d may include a proportional-integral-derivative (PID) algorithm.

The low-speed DA converter 108e performs a DA conversion in a speed of, for example, several M samples/second, on the control signals generated based on the error signals of the sampling timing output from the loop filter 108d and to be provided to the voltage-controlled oscillator 104b and supplies the control voltage obtained through DA conversion to the voltage-controlled oscillator 104b. The voltage-controlled oscillator 104b that is a clock generating source in which the oscillation frequency changes based on the supplied control voltage generates the clock regulating the sampling timing for providing to the high-speed AD converter 104a. If the control voltage supplied to the voltage-controlled oscillator 104b is appropriately controlled, the phase of the generated clock can also be controlled which is self-evident to those skilled in the art. The clock that is generated by the voltage-controlled oscillator 104b is, for example, approximately 40 giga hertz (GHz).

Figure 11:
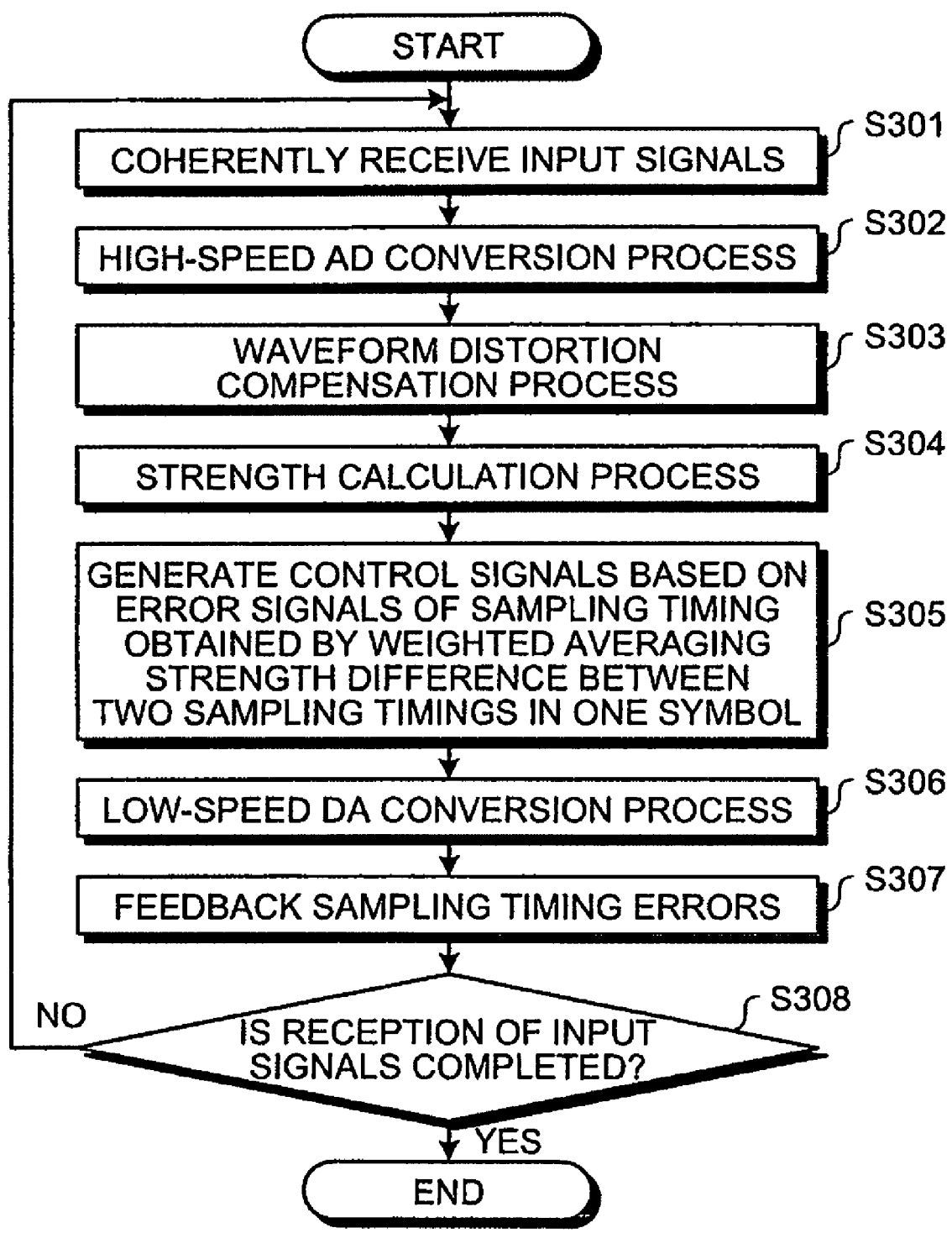
FIG. 11 is a flowchart of an AD conversion control procedure according to the second embodiment.

The AD conversion control process executed by the optical receiving device 100b according to the second embodiment shown in FIG. 10 is explained. FIG. 11 is a flowchart of the AD conversion control procedure according to the second embodiment. In the AD conversion control, the clock is controlled that generates the sampling timing and that is provided from the voltage-controlled oscillator 104b to the high-speed AD converter 104a.

First, the optical receiving unit 103 of the optical receiving device 100b coherently receives the input signals from the RZ-mPSK optical transmitting device 200 (step S301). The high-speed AD converter 104a converts the analog signals upon coherently receiving the input signals at step S301 into the digital complex signals (step S302). The digital filtering unit 105 electrically compensates the waveform distortion of the converted complex digital signals (step S303).

The strength calculating unit 108a calculates the strength of the complex digital signals of which the waveform distortion is electrically compensated by the digital filtering unit 105 (step S304). The demux 108b, the subtracter 108c, and the loop filter 108d retrieve the error signals of the sampling timing based on the calculation indicated in the expression (2). Based on the retrieved error signals, the demux 108b, the subtracter 108c, and the loop filter 108d generate the control signals for providing to the voltage-controlled oscillator 104b (step S305).

The low-speed DA converter 108e DA converts the control signals (step S306) and supplies the control voltage to the voltage-controlled oscillator 104b (step S307). A controller of the optical receiving device 100b determines whether the cessation of the reception of the optical input signals means the completion of the reception of input signals or not (step S308). If reception of the input signals is completed (Yes at step S308), the AD conversion controlling process ends and if reception of the input signals is not completed (No at step S308), the controller of the optical receiving device 100b proceeds to step S301.

Figure 12A:
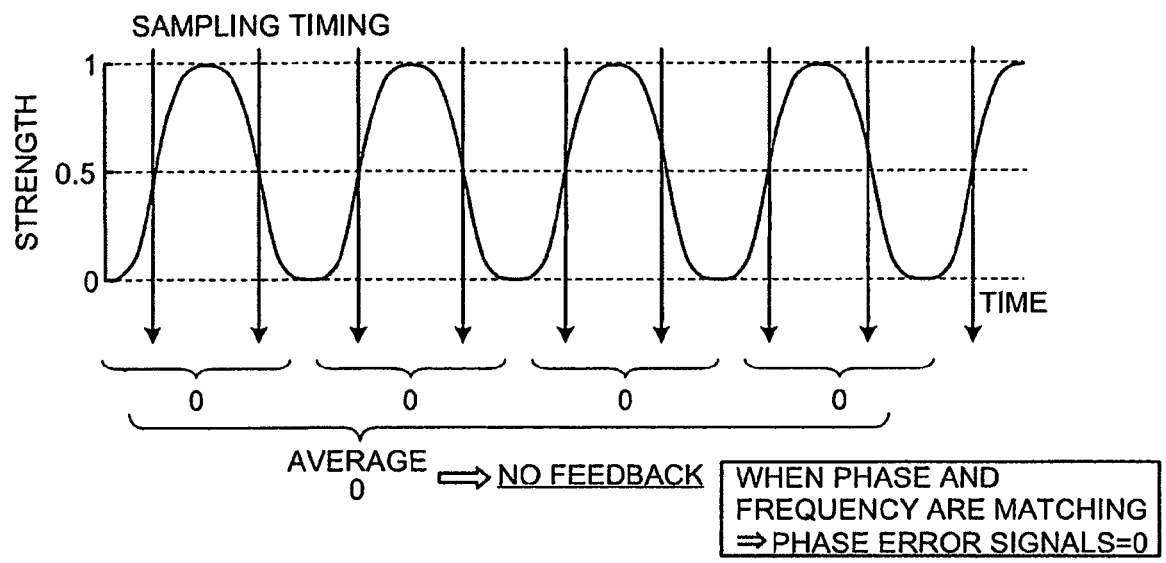
FIG. 12A is a schematic for explaining an overview of phase synchronization (when a phase is maintained in a present state) between an AD conversion timing and input signals according to the second embodiment.
Figure 12B:
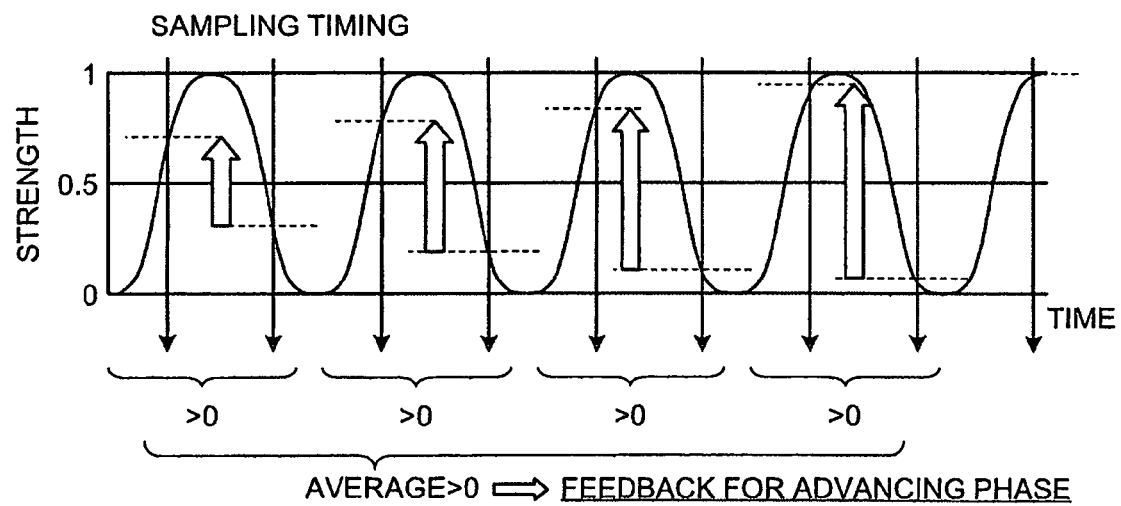
FIG. 12B is a schematic for explaining the overview of the phase synchronization (when a feedback is generated for leading the phase) between the AD conversion timing and the input signals according to the second embodiment.
Figure 12C:
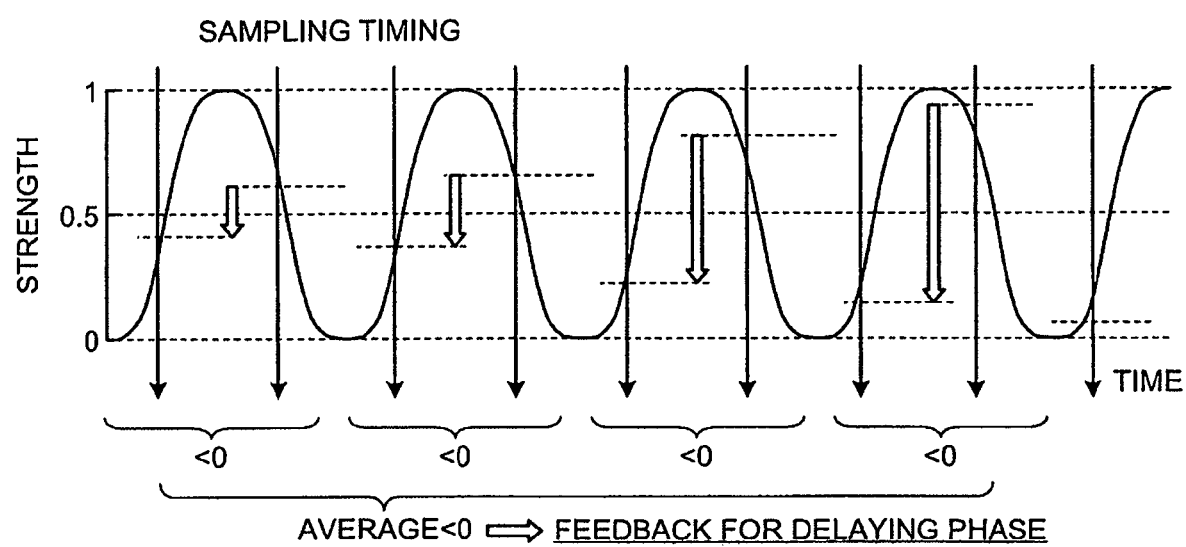
FIG. 12C is a schematic for explaining the overview of the phase synchronization (when the feedback is generated for delaying the phase) between the AD conversion timing and the input signals according to the second embodiment.

Next, the phase synchronization of the sampling timing of the AD conversion and the input signals by the high-speed AD converter 104a shown in FIG. 10 is explained. FIGS. 12A, 12B, and 12C are schematics explaining an overview of the phase synchronization between the AD conversion timing and the input signals according to the second embodiment. As shown in FIGS. 12A, 12B, and 12C, the vertical axis represents the strength and the horizontal axis represents the time. While the strength of the input signals changes over time, sampling is performed on the input signals at the predetermined timing, twice for each symbol. One symbol corresponds to one mountain of the waveform of the strength.

The feedback control of the sampling timing is explained in detail. FIG. 12A is a schematic for explaining a synchronization status of the phase between the AD conversion timing and the input signals according to the second embodiment. As shown in FIG. 12A, when the strengths at two sampling timings are the same in one symbol, the feedback control is not performed for the phase of the sampling timing, and the error signals of the sampling timing calculated in the expression (2) are zero.

FIG. 12B is a schematic for explaining the overview of a case where the feed back is performed to advance the phase, as an example of a phase relation between the AD conversion timing and the input signals according to the second embodiment. As shown in FIG. 12B, when the strengths at the two sampling timings are different in one symbol, and upon deducting the second strength from the first strength, the deduction result becomes positive, the feedback control is performed such that the clock phase of the sampling timing will be advanced. The value of the error signals of the sampling timing calculated in the expression (2) is positive. Therefore, the voltage according to the voltage-controlled oscillator 104b increases and the clock frequency generated by the voltage-controlled oscillator 104b increases.

FIG. 12C is a schematic for explaining the overview of a case where the feed back is performed to delay the phase, as an example of the phase relation between the clock and the input signals of the AD conversion timing according to the second embodiment. As shown in FIG. 12C, when the strengths at two sampling timings in one symbol are different, and upon deducting the second strength from the first strength, the deduction result is negative, the feedback control is performed such that the clock phase of the sampling timing will be delayed, and the value of the error signals of the sampling timing calculated in the expression (2) is negative. By decreasing the voltage according to the voltage-controlled oscillator 104b, for example, the clock frequency generated by the voltage-controlled oscillator 104b decreases.

The embodiments of the present invention have been explained. However, the invention in its broader aspects is not limited to the specific details and representative embodiments shown and described herein. Accordingly, various modifications may be made without departing from the spirit or scope of the general inventive concept as defined by the appended claims and their equivalents. Further, the embodiments may have additional effects other than those described above.

Figure 13A:
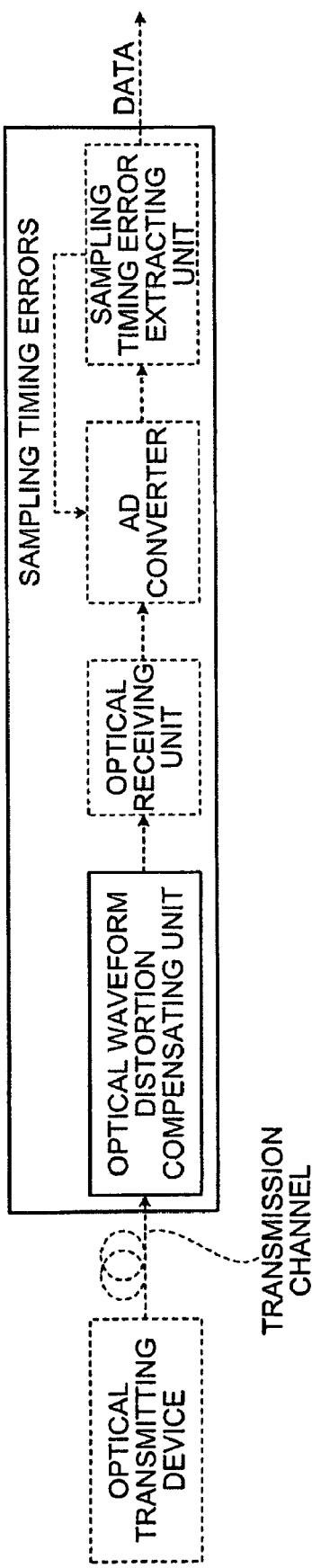
FIG. 13A is a block diagram of the optical receiving device based on a first variation in a position of a waveform distortion compensating unit.

The optical receiving device according to the first and the second embodiments compensates the waveform distortion of the received waves by performing the electric waveform distortion compensation after the optically received signals are subjected to high-speed AD conversion. However, as shown in FIG. 13A, the optical receiving device may perform the optical waveform distortion compensation to compensate the waveform distortion at the optical signal level, before optically receiving the signal waves. Then, since the waveform distortion compensation is performed at the optical signal level, the processing load on the subsequent digital processing units can be reduced.

Figure 13B:
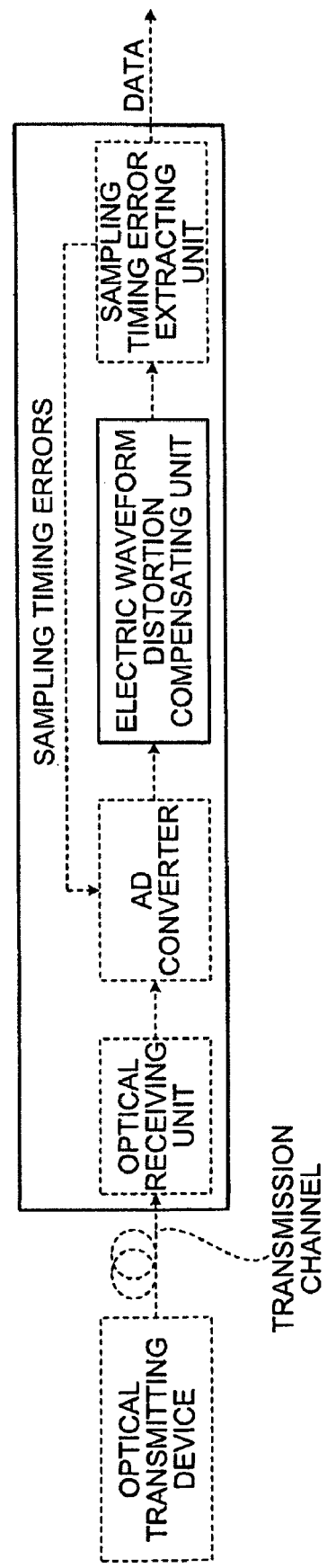
FIG. 13B is a block diagram of the optical receiving device based on a second variation in the position of the waveform distortion compensating unit.

Further, as shown in FIG. 13B, the optical receiving device may perform waveform distortion compensation of the received waves by compensating the electric waveform distortion after the received optical signals are subjected to the high-speed AD conversion. The waveform distortion compensation is carried out with respect to the complex digital signals. When the waveform distortion compensation is performed on the complex digital signals, it can be performed by the digital processor. Because the waveform distortion compensation is performed electrically, it is not necessary to add a specific hardware structure, and the waveform distortion can be compensated by a digital process.

Figure 13C:
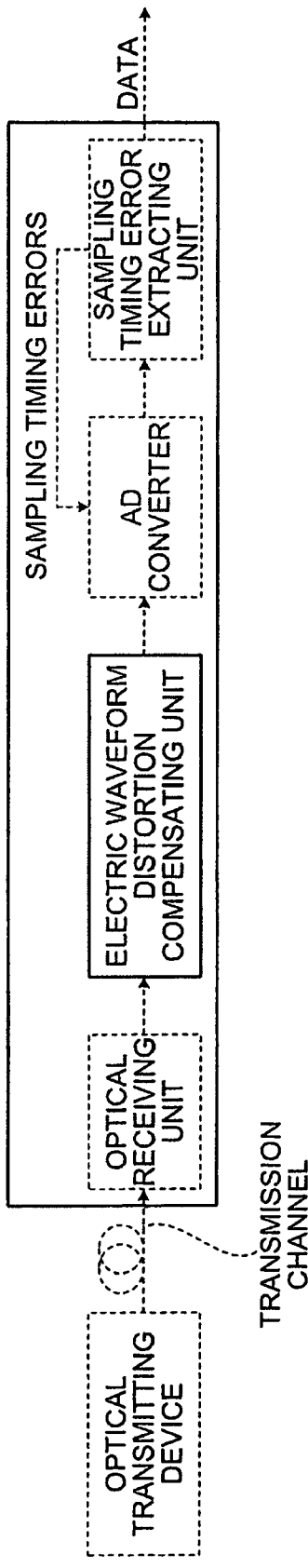
FIG. 13C is a block diagram of the optical receiving device based on a third variation in the position of the waveform distortion compensating unit.

As shown in FIG. 13C, the optical receiving device may compensate the waveform distortion of the received waves by performing the electric waveform distortion compensation before the received optical signals are subjected to the high-speed AD conversion. In this case, the waveform distortion compensation is performed on the analog signals.

Figure 13D:
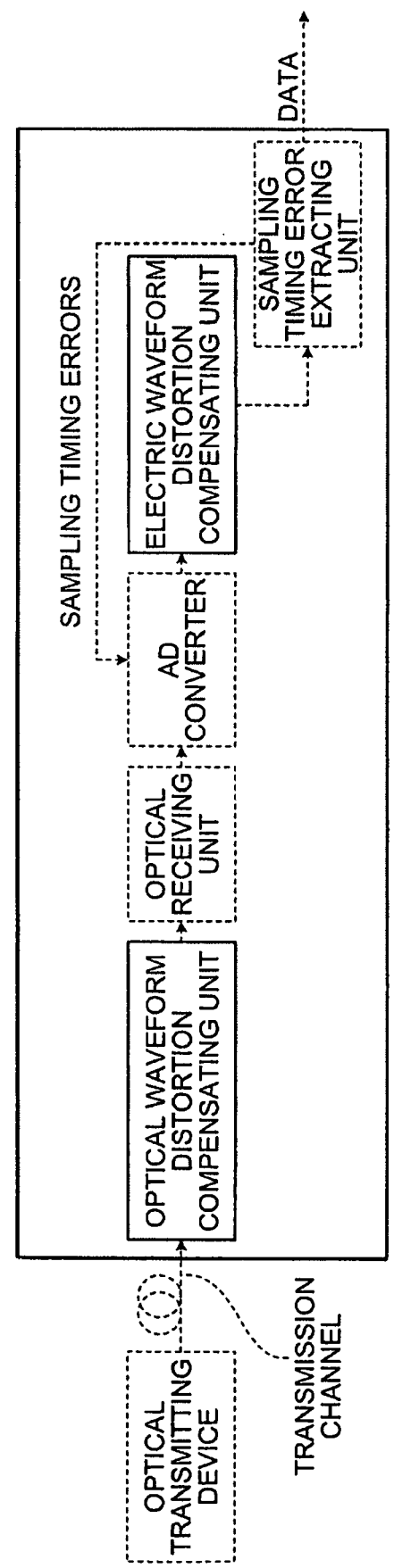
FIG. 13D is a block diagram of the optical receiving device based on a forth variation in the position of the waveform distortion compensating unit.

As shown in FIG. 13D, the optical receiving device may perform the optical waveform distortion compensation to compensate the waveform distortion at the optical signal level before coherently and optically receiving the signal waves. Further, the optical receiving device may perform the electric waveform distortion compensation after the signals subjected to the optical waveform distortion compensation are coherently and optically received and subjected to the high-speed AD conversion. In this case, the waveform distortion can be compensated more securely. Since the waveform distortion compensation at the optical signal level is followed by the electric waveform distortion compensation, more accurate waveform distortion compensation can be realized.

In FIG. 6 of the first embodiment, the digital filtering unit 105 includes the lock status checking unit 105d. In general, for checking the clock regeneration lock status, it is necessary to output the signals subjected to the waveform distortion compensation in the digital filtering unit 105 to the outside of the digital filtering unit 105, and to perform specific signal processing, such as, sampling timing error extraction. In other words, the clock regeneration lock status is checked outside the digital filtering unit 105. For example, in some structure, it is checked whether the control voltage supplied to the voltage-controlled oscillator 104b from the low-speed DA converter 107g is within the predetermined range specified at the time of designing. To adopt to such structure, the digital filtering unit 105 may not include the lock status checking unit 105d, and change the coefficient associated with the waveform distortion status based on a check result of the lock status that is carried out outside.

Here, the digital filtering unit 105 is a waveform-distortion compensating device that, within the optical receiving device, converts the optically received signals into digital signals through AD conversion, compensates the waveform distortion of the digital signals based on the status of clock regeneration of the digital signals, and outputs the results. The waveform-distortion compensating device includes, a storage unit that stores therein for each waveform distortion status di ($1 \leq i \leq m$) of m number ordered from 1 to m (m is the positive integer greater than 1), a combination of the coefficients $Cd_{i\_1}$, $Cd_{i\_2}$ and so on up to $Cd_{i\_n}$ of n number, a selecting unit that selects one combination of the coefficients from the storage unit in the order, and a waveform distortion compensating unit that compensates the waveform distortion of the digital signals based on the one combination of coefficients selected by the selecting unit. The selecting unit reselects, upon determining that the clock cannot be regenerated, based on combination of coefficients $C_{d(j+1)\_(k+1)}$ ($1 \leq j \leq i-1$) that is first selected in the order mentioned earlier, a combination of the coefficients $C_{d(j+1)\_(k+1)}$ subsequent among the ordered coefficients. The waveform distortion compensating unit compensates the waveform distortion of the digital signals, based on the combination of the coefficients $C_{d(j+1)\_(k+1)}$ reselected by the selecting unit.

All the automatic processes explained in the present embodiments can be, entirely or in part, carried out manually. Similarly, all the manual processes explained in the present embodiments can be entirely or in part carried out automatically by a known method. The process procedures, the control procedures, specific names, and data, including various parameters mentioned in the embodiments can be changed as required unless otherwise specified.

The constituent elements of the device illustrated are merely conceptual and may not necessarily physically resemble the structures shown in the drawings. For instance, the device need not necessarily have the structure that is illustrated. The device as a whole or in parts can be broken down or integrated either functionally or physically in accordance with the load or how the device is to be used.

The process functions performed by the device are entirely or partially realized by control devices such as a central processing unit (CPU), or a micro computer unit (MCU) or a micro processing unit (MPU) or a field programmable gate array (FPGA) or a digital signal processor (DSP) or by a program executed by the CPU or the MCU or the MPU or the FPGA or the DSP or by a superior hardware such as an application specific integrated circuit (ASIC) using wired logic.

According to an embodiment of the present invention, even if the sampling rate of the AD conversion is equal to or higher than the symbol rate of the high-speed optical signals and not more than few times the symbol rate of the high-speed optical signals, the AD conversion can be carried out at an appropriate timing.

According to an embodiment of the present invention, since the waveform distortion is compensated in a digital signal region obtained as a result of conversion of the optically received signals, a swift waveform distortion compensation can be realized through the processing by a digital processor.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An analog-to-digital (AD) conversion controller that controls, in an optical receiving device receiving optical signals of which an optical intensity waveform of each symbol is a return-to-zero (RZ) pulse, an AD converter that converts received signals into digital signals by AD conversion at a predetermined sampling timing, the AD conversion controller comprising:
    a sampling timing pulse source that generates a pulse regulating the predetermined sampling timing and electrically controls a phase of the pulse;
    an error estimator that estimates sampling timing errors of the AD conversion of the digital signals based on a result of the AD conversion by the AD converter;
    a control-value calculating unit that calculates a control value for controlling the phase of the sampling timing pulse source based on the sampling timing errors estimated by the error estimator; and
    a compensator that performs feedback compensation of the phase of the pulse regulating the predetermined sampling timing based on the control value calculated by the control-value calculating unit.

2. The AD conversion controller according to claim 1, further comprising
    a digital-to-analog (DA) converter that is arranged between the control-value calculating unit and the sampling timing pulse source, wherein
    the compensator performs the feedback compensation of the phase of the pulse regulating the predetermined sampling timing, based on an analog value obtained through conversion by the DA converter of the control value calculated through a digital arithmetic process by the control-value calculating unit.

3. An AD conversion controller that controls, in an optical receiving device receiving optical signals of which an optical intensity waveform of each symbol is an RZ pulse, an AD converter that converts received signals into digital signals by AD conversion at a predetermined sampling timing, the AD conversion controller comprising:
    a sampling timing pulse source that generates a pulse regulating the predetermined sampling timing, and electrically controls a phase of the pulse;
    a control-value calculating unit that estimates sampling timing errors of the AD conversion of the digital signals based on a result of the AD conversion by the AD converter, and calculates a control value for controlling the phase of the sampling timing pulse source based on the estimated sampling timing errors; and
    a compensator that performs feedback compensation of the phase of the pulse regulating the predetermined sampling timing based on the control value calculated by the control-value calculating unit.

4. The AD conversion controller according to claim 3, further comprising
    a digital-to-analog (DA) converter that is arranged between the control-value calculating unit and the sampling timing pulse source, wherein
    the compensator performs the feedback compensation of the phase of the pulse regulating the predetermined sampling timing, based on an analog value obtained through conversion by the DA converter of the control value calculated through a digital arithmetic process by the control-value calculating unit.

5. The AD conversion controller according to claim 3, wherein
    the control-value calculating unit estimates the sampling timing errors of the AD conversion of the complex digital signals by multiplying the absolute value of the complex digital signals or the value corresponding one-to-one with the absolute value of the complex digital signals by a first dithering signal, and adds a second dithering signal synchronized with the first dithering signal to a value calculated based on the estimated sampling timing errors, to calculate the control value for controlling the phase of the sampling timing pulse source.

6. The AD conversion controller according to claim 3, wherein
    the control-value calculating unit estimates, when an average sampling frequency of the AD conversion is n (n is a positive integer equal to or more than two) times a symbol rate of the received optical signals, the sampling timing errors based on a difference between absolute values of two of the complex digital signals selected from one symbol of the received signals according to a predetermined manner of selection and subjected to AD conversion by the AD converter or a difference between values corresponding one-to-one with the absolute values of the complex digital signals, and calculates the control value for controlling the phase of the sampling timing pulse source based on the estimated sampling timing errors.

7. The AD conversion controller according to claim 3, wherein the AD converter performs the AD conversion on signals obtained as a result of waveform distortion compensation of the received optical signals at an optical signal level.

8. The AD conversion controller according to claim 3, wherein the control-value calculating unit estimates the sampling timing errors based on a difference between the absolute values of the complex digital signals or a difference between values corresponding one-to-one with the absolute values of the complex digital signals those are based on signals obtained as a result of electric waveform distortion compensation of the complex digital signals, and calculates the control value for controlling the phase of the sampling timing pulse source based on the estimated sampling timing errors.

9. The AD conversion controller according to claim 3, wherein the AD converter performs the AD conversion on the signals obtained as a result of waveform distortion compensation of the received optical signals at an electric signal level.

10. An AD conversion controller that controls, in an optical receiving device receiving optical signals of which an optical intensity waveform of each symbol is an RZ pulse, an AD converter that converts received optical signals into complex digital signals by AD conversion at a predetermined sampling timing, the AD conversion controller comprising:

a sampling timing pulse source that generates a pulse regulating the predetermined sampling timing and electrically controls a phase of the pulse;

a strength calculating unit that calculates an absolute value of the complex digital signals obtained as a result of the AD conversion by the AD converter or a value corresponding one-to-one with the absolute value of the complex digital signals;

a control-value calculating unit that estimates, based on the absolute value of the complex digital signals or the value corresponding one-to-one with the absolute value of the complex digital signals calculated by the strength calculating unit, sampling timing errors of AD conversion of the complex digital signals, and calculates a control value for controlling the phase of the sampling timing pulse source based on the estimated sampling timing errors; and a compensator that performs feedback compensation of the phase of the pulse regulating the predetermined sampling timing based on the control value calculated by the control-value calculating unit.

11. The AD conversion controller according to claim 10, further comprising a digital-to-analog (DA) converter that is arranged between the control-value calculating unit and the sampling timing pulse source, wherein the compensator performs the feedback compensation of the phase of the pulse regulating the predetermined sampling timing, based on an analog value obtained through conversion by the DA converter of the control value calculated through a digital arithmetic process by the control-value calculating unit.

12. The AD conversion controller according to claim 10, wherein the control-value calculating unit estimates the sampling timing errors of the AD conversion of the complex digital signals by multiplying the absolute value of the complex digital signals or the value corresponding one-to-one with the absolute value of the complex digital signals by a first dithering signal, and adds a second dithering signal synchronized with the first dithering signal to a value calculated based on the estimated sampling timing errors, to calculate the control value for controlling the phase of the sampling timing pulse source.

13. The AD conversion controller according to claim 10, wherein the control-value calculating unit estimates, when an average sampling frequency of the AD conversion is n (n is a positive integer equal to or more than two) times a symbol rate of the received optical signals, the sampling timing errors based on a difference between absolute values of two of the complex digital signals selected from one symbol of the received signals according to a predetermined manner of selection and subjected to AD conversion by the AD converter or a difference between values corresponding one-to-one with the absolute values of the complex digital signals, and calculates the control value for controlling the phase of the sampling timing pulse source based on the estimated sampling timing errors.

14. The AD conversion controller according to claim 10, wherein the AD converter performs the AD conversion on signals obtained as a result of waveform distortion compensation of the received optical signals at an optical signal level.

15. The AD conversion controller according to claim 10, wherein the control-value calculating unit estimates the sampling timing errors based on a difference between the absolute values of the complex digital signals or a difference between values corresponding one-to-one with the absolute values of the complex digital signals those are based on signals obtained as a result of electric waveform distortion compensation of the complex digital signals, and calculates the control value for controlling the phase of the sampling timing pulse source based on the estimated sampling timing errors.

16. The AD conversion controller according to claim 10, wherein the AD converter performs the AD conversion on the signals obtained as a result of waveform distortion compensation of the received optical signals at an electric signal level.

17. An optical receiving device for outputting received data, based on complex digital signals obtained as a result of AD conversion of received signals at a predetermined sampling timing, the received signals being generated based on optical signals of which an optical intensity waveform of each symbol is an RZ pulse, the optical receiving device comprising:

a sampling timing pulse source that generates a pulse regulating the predetermined sampling timing and electrically controls a phase of the pulse;

an AD converter that performs AD conversion of the received signals at the predetermined sampling timing;

a control-value calculating unit that calculates an absolute value of the complex digital signals obtained as a result of the AD conversion by the AD converter or a value corresponding one-to-one with the absolute value of the complex digital signals, estimates sampling timing errors of the AD conversion of the complex digital signals, based on the calculated absolute value of the complex digital signals or the value corresponding one-to-one with the absolute value of the complex digital signals, and calculates a control value for controlling the phase of the sampling timing pulse source based on the estimated sampling timing errors; and a compensator that performs feedback compensation of the phase of the pulse regulating the predetermined sampling timing based on the control value calculated by the control-value calculating unit.

18. The optical receiving device according to claim 17 further comprising a DA converter that is arranged between the control-value calculating unit and the sampling timing pulse source, wherein the compensator performs the feedback compensation of the phase of the pulse regulating the predetermined sampling timing, based on an analog value obtained as a result of conversion by the DA converter of the control value calculated through a digital arithmetic process by the control-value calculating unit.

19. The optical receiving device according to claim 17, wherein the control-value calculating unit estimates the sampling timing errors based on a value obtained by multiplying a first dithering signal by the absolute value of the complex digital signals or the value corresponding one-to-one with the absolute value of the complex digital signals, and adds a second dithering signal synchronized with the first dithering signal to a value calculated based on the estimated sampling timing errors, to calculate the control value for controlling the phase of the sampling timing pulse source.

20. The optical receiving device according to claim 17, wherein the control-value calculating unit estimates, when the predetermined sampling timing is n (n is a positive integer equal to or more than 2) times a symbol rate of the received optical signals, the sampling timing errors based on a difference between absolute values of two of the complex digital signals selected from one symbol of the received optical signals according to a predetermined manner of selection and subjected to the AD conversion by the AD converter or a difference between values corresponding one-to-one with the absolute values of the complex digital signals, and calculates the control value for controlling the phase of the sampling timing pulse source based on the estimated sampling timing errors.

21. The optical receiving device according to claim 17 further comprising:

an optical signal waveform distortion compensating unit that compensates waveform distortion of the received optical signals at an optical signal level, wherein the AD converter performs the AD conversion of signals obtained as a result of the waveform distortion compensation by the optical signal waveform distortion compensating unit.

22. The optical receiving device according to claim 17 further comprising:

an electric signal waveform distortion compensating unit that compensates waveform distortion of the received optical signals at an electric signal level, wherein the control-value calculating unit estimates the sampling timing errors based on a difference between the absolute values of the complex digital signals those are based on the signals obtained as a result of waveform distortion compensation of the complex digital signals by the electric signal waveform distortion compensating unit or a difference between values corresponding one-to-one with the absolute values of the complex digital signals, and calculates the control value for controlling the phase of the sampling timing pulse source based on the estimated sampling timing errors.

23. The optical receiving device according to claim 17 further comprising:

an electric signal waveform distortion compensating unit that compensates waveform distortion of the received optical signals at an electric signal level, wherein the AD converter performs the AD conversion of the signals obtained as a result of the waveform distortion compensation by the electric signal waveform distortion compensating unit.

24. An optical receiving method for outputting received data, based on complex digital signals obtained as a result of AD conversion of received signals at a predetermined sampling timing, the received signals being generated based on optical signals of which an optical intensity waveform of each symbol is an RZ pulse, the optical receiving method comprising:

sampling timing pulse generating of generating a pulse regulating the predetermined sampling timing and electrically controlling a phase of the pulse;

AD converting of performing AD conversion of the received signals at the predetermined sampling timing;

strength calculating of calculating an absolute value of the complex digital signals obtained as a result of the AD conversion in the AD converting or a value corresponding one-to-one with the absolute value of the complex digital signals;

error estimating of estimating sampling timing errors of the AD conversion of the complex digital signals, based on the absolute value of the complex digital signals or the value corresponding one-to-one with the absolute value of the complex digital signals calculated in the strength calculating;

control value calculating of calculating a control value for controlling the phase of the pulse generated in the sampling timing pulse generating based on the estimated sampling timing errors; and compensating of performing feedback compensation of the phase of the pulse regulating the predetermined sampling timing based on the control value calculated in the control value calculating.

25. The optical receiving method according to claim 24, wherein the compensating includes performing the feedback compensation of the phase of the pulse regulating the predetermined sampling timing based on an analog value obtained by digital-to-analog conversion of the control values calculated through a digital arithmetic process in the control value calculating.

26. The optical receiving method according to claim 24, wherein
the error estimating includes calculating the sampling timing errors by mixing the absolute value of the complex digital signals or the value corresponding one-to-one with the absolute value of the complex digital signals with a first dithering signal, and
the control value calculating includes calculating the control value for controlling the phase of the pulse generated in the sampling timing pulse generating by adding a second dithering signal synchronized with the first dithering signal to the control value calculated based on the sampling timing errors.

27. The optical receiving method according to claim 24, wherein
the error estimating includes calculating, when the predetermined sampling timing is n (n is a positive integer equal to or more than 2) times a symbol rate of the received signals, the sampling timing errors based on a difference between absolute values of two of the complex digital signals obtained based on values selected from one symbol of the received optical signals according to a predetermined manner of selection and subjected to the AD conversion in the AD converting, or a difference between values corresponding one-to-one with the absolute values of the complex digital signals.

28. The optical receiving method according to claim 24, further comprising
optical signal waveform distortion compensating of compensating waveform distortion of the received signals at an optical signal level, wherein
the AD converting includes performing the AD conversion on a signal obtained as a result of the compensation of the waveform distortion in the optical signal waveform distortion compensating.

29. The optical receiving method according to claim 24 further including,
electric signal waveform distortion compensating of compensating waveform distortion of the received signals at an electric signal level, wherein
the error estimating includes calculating the sampling timing errors, based on the difference between the absolute values of the complex digital signals those are based on the signals obtained as a result of the compensation of the waveform distortion of the complex digital signals in the electric signal waveform distortion compensating, or the difference between the values corresponding one-to-one with the absolute values of the complex digital signals.

30. The optical receiving method according to claim 24, further comprising
electric signal waveform distortion compensating of compensating waveform distortion of the received signals at an electric signal level, wherein
the AD converting includes performing the AD conversion on a signal obtained as a result of the compensation of the waveform distortion in the electric signal waveform distortion compensating.

31. A waveform-distortion compensating device that performs AD conversion to convert optically received signals into digital signals, compensates waveform distortion of the digital signals, and outputs resulting signals in an optical receiving device, the waveform-distortion compensating device comprising:
a storage unit that stores therein for each waveform distortion status $d_i$ ($1 \leq i \leq m$) of m number ordered from 1 to m (m is a positive integer greater than 1), a combination of coefficients $C_{di\_1}$, $C_{di\_2}$ and so on up to $C_{di\_n}$ of n number for each waveform distortion status $d_i$;
a selecting unit that selects in the order, one combination of coefficients from the storage unit;
a waveform distortion compensating unit that compensates the waveform distortion of the digital signals, based on the one combination of the coefficients selected by the selecting unit; and
a checking unit that checks whether a clock can be regenerated or not, based on a result of compensation by the waveform distortion compensating unit, wherein
the selecting unit reselects a combination of subsequent coefficients $C_{d(j+1)\_(k+1)}$ ($1 \leq j \leq l-1$, k is a positive integer that satisfies $0 \leq k \leq n-1$) in the order, when a result of checking by the checking unit based on a combination of coefficients $C_{dj\_(k+1)}$ selected previously in the order indicates that the clock cannot be regenerated, and
the waveform distortion compensating unit compensates, based on the combination of the coefficients $C_{d(j+1)\_(k+1)}$ reselected by the selecting unit, the waveform distortion of the digital signals.

32. The waveform-distortion compensating device according to claim 31, wherein
the waveform distortion compensating unit sums up, upon multiplying the coefficients $C_{di\_(k+1)}$ selected by the selecting unit by the digital signals, respectively, delayed by a time period k×τ (k is a positive integer that satisfies $0 \leq k \leq n-1$ and τ is a predetermined time), multiplication results, and compensates the waveform distortion of the digital signals.

33. The waveform-distortion compensating device according to claim 31, wherein when a result of checking by the checking unit indicates that the clock can be regenerated, the waveform-distortion compensating device proceeds to an adaptive control of the coefficients.

* * * * *